(12) United States Patent  
Barnett

(10) Patent No.: US 7,428,136 B2
(45) Date of Patent: Sep. 23, 2008

(54) INTEGRAL CHARGE STORAGE BASEMENT AND WIDEBAND EMBEDDED DECOUPLING STRUCTURE FOR INTEGRATED CIRCUIT

(75) Inventor: Ronald J. Barnett, Santa Rosa, CA (US)

(73) Assignee: GeoMat Insights, LLC, Santa Rosa, CA (US)

( * ) Notice: Subject to any disclaimer, the term of this patent is extended or adjusted under 35 U.S.C. 154(b) by 257 days.

(21) Appl. No.: 11/198,257

(22) Filed: Aug. 6, 2005

(65) Prior Publication Data

US 2007/0030626 A1 Feb. 8, 2007

(51) Int. Cl.
*H01G 4/228* (2006.01)

(52) U.S. Cl. .............. 361/306.2; 361/306.1; 361/306.3; 361/311; 361/313; 361/321.1

(58) Field of Classification Search .............. 361/306.2, 361/306.1, 306.3, 311–313, 321.1, 321.2, 361/321.4, 302–305, 301.1, 301.4; 257/301, 257/303

See application file for complete search history.

(56) References Cited

U.S. PATENT DOCUMENTS

| | | | |
|---|---|---|---|
| 5,010,641 A | 4/1991 | Sisler | |
| 5,079,069 A * | 1/1992 | Howard et al. | 428/209 |
| 5,162,977 A | 11/1992 | Paurus et al. | |
| 5,847,936 A * | 12/1998 | Forehand et al. | 361/794 |
| 5,920,454 A * | 7/1999 | Nomura et al. | 361/313 |
| 6,011,683 A * | 1/2000 | Dat | 361/306.1 |
| 6,104,258 A | 8/2000 | Novak | |
| 6,128,199 A * | 10/2000 | Kambara | 361/760 |
| 6,278,356 B1 * | 8/2001 | Lin et al. | 338/309 |
| 6,388,207 B1 * | 5/2002 | Figueroa et al. | 174/262 |
| 6,559,484 B1 * | 5/2003 | Li et al. | 257/207 |
| 6,819,200 B2 * | 11/2004 | Zhao et al. | 333/26 |
| 7,034,633 B2 * | 4/2006 | Passiopoulos et al. | 333/116 |
| 2004/0145425 A1 | 7/2004 | Grebenkemper | |

* cited by examiner

*Primary Examiner*—Nguyen T. Ha
(74) *Attorney, Agent, or Firm*—Jessica Costa

(57) ABSTRACT

A capacitive structure and technique for allowing near-instantaneous charge transport and reliable, wide-band RF ground paths in integrated circuit devices such as integrated circuit dies, integrated circuit packages, printed circuit boards, and electronic circuit substrates is presented. Methods for introducing resistive loss, dielectric loss, magnetic loss, and/or radiation loss in a signal absorption ring implemented around a non-absorptive area of one or more conductive layers of an integrated circuit structure to dampen laterally flowing Electro-Magnetic (EM) waves between electrically adjacent conductive layers of the device are also presented.

25 Claims, 22 Drawing Sheets

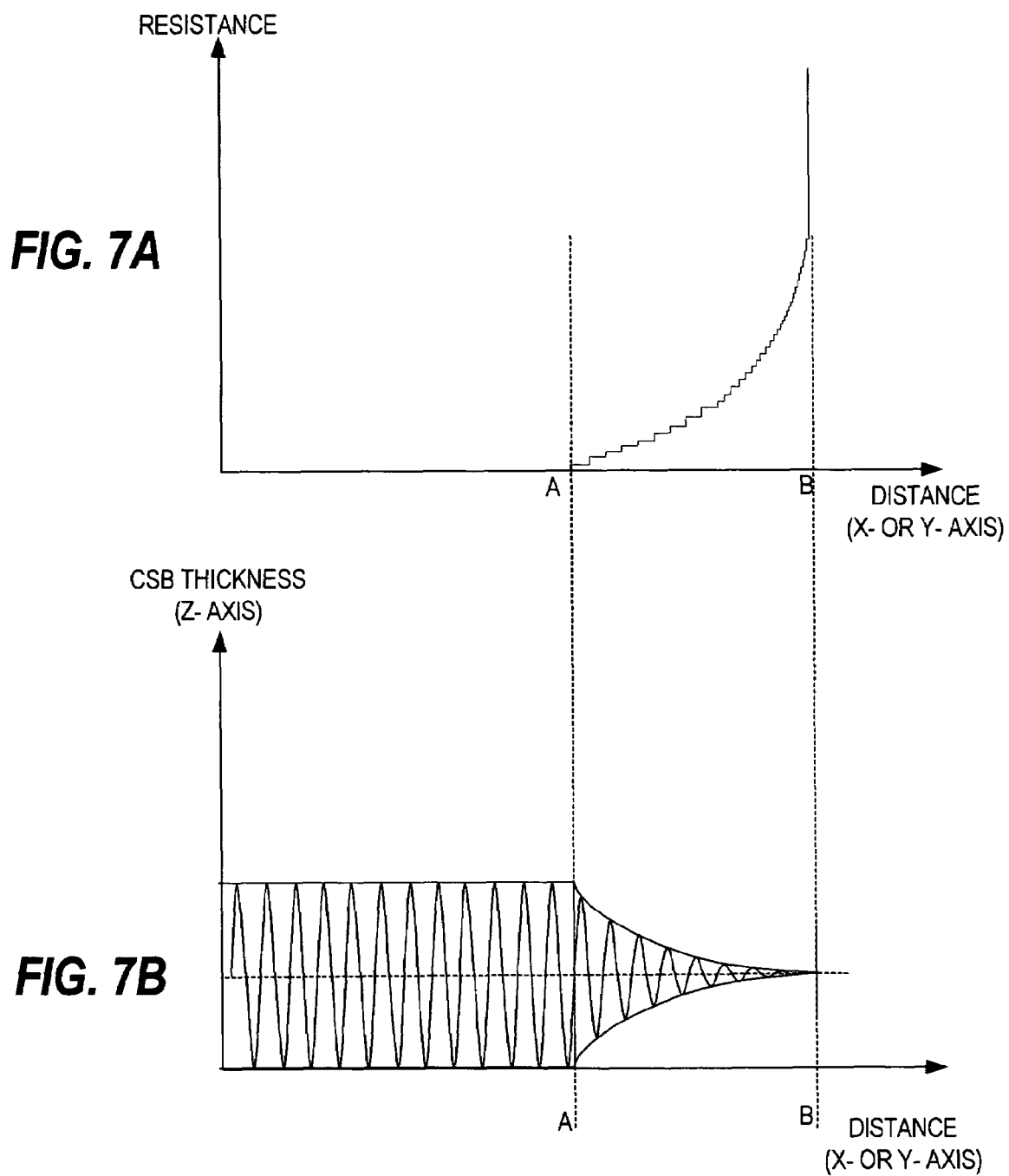

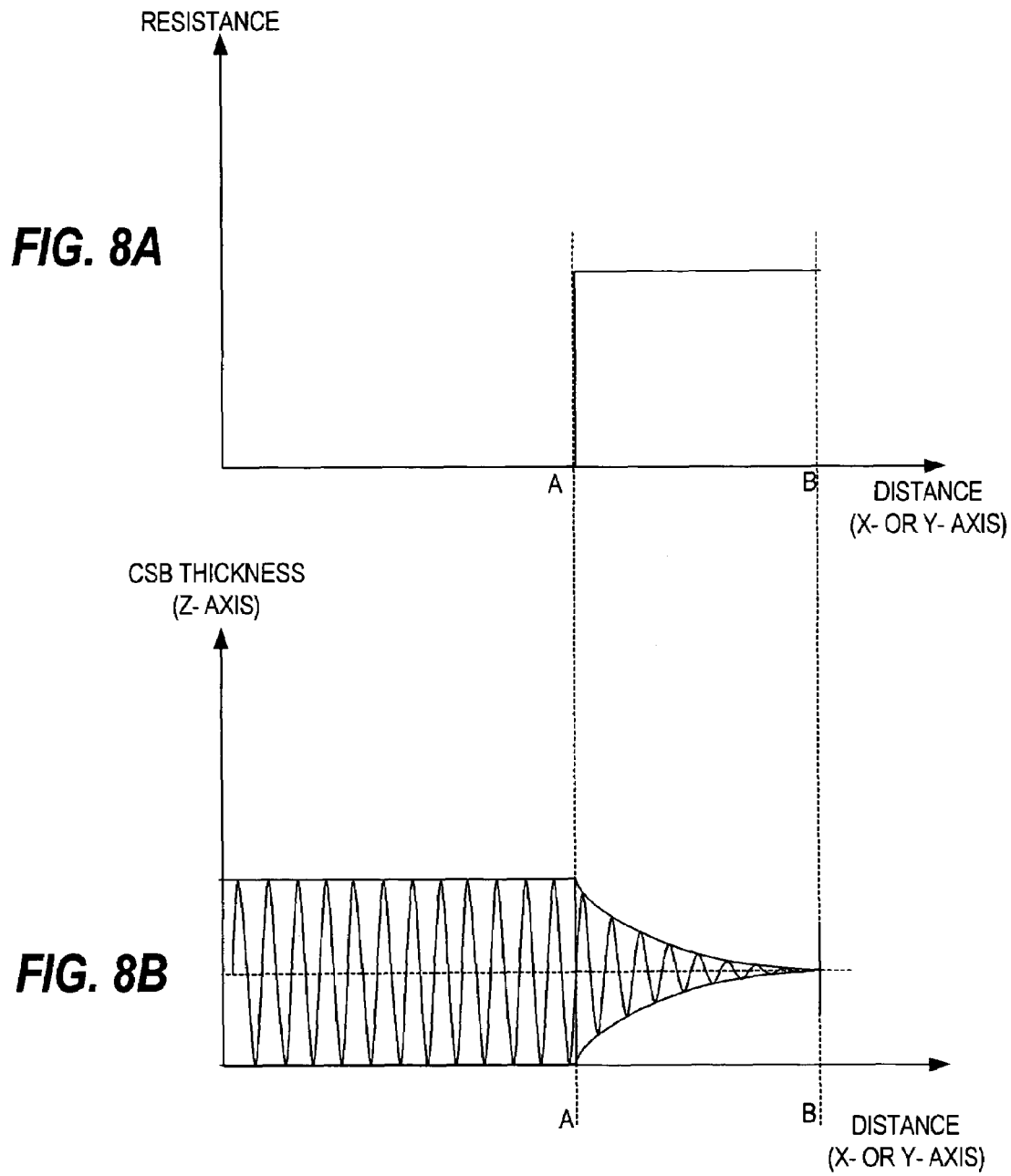

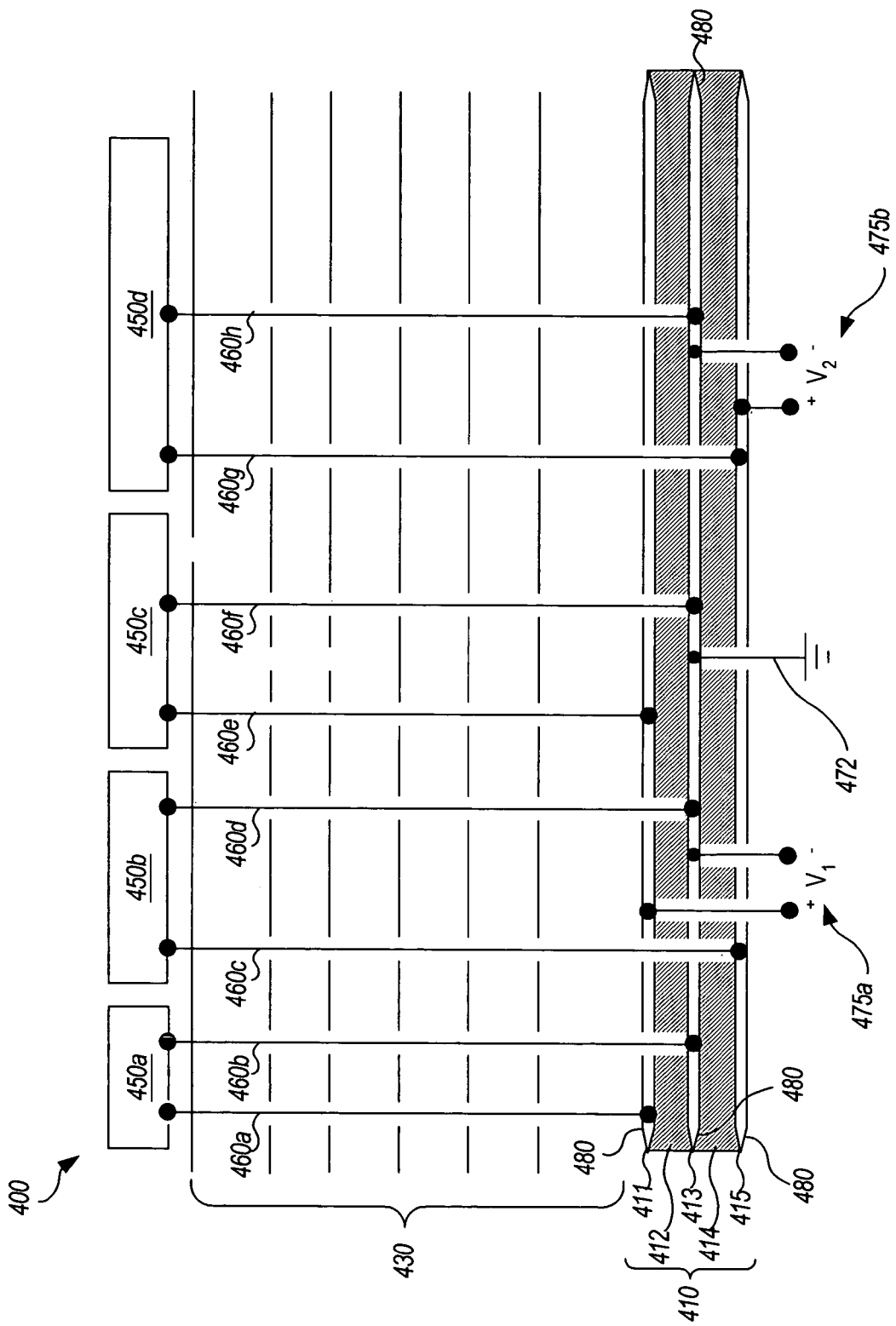

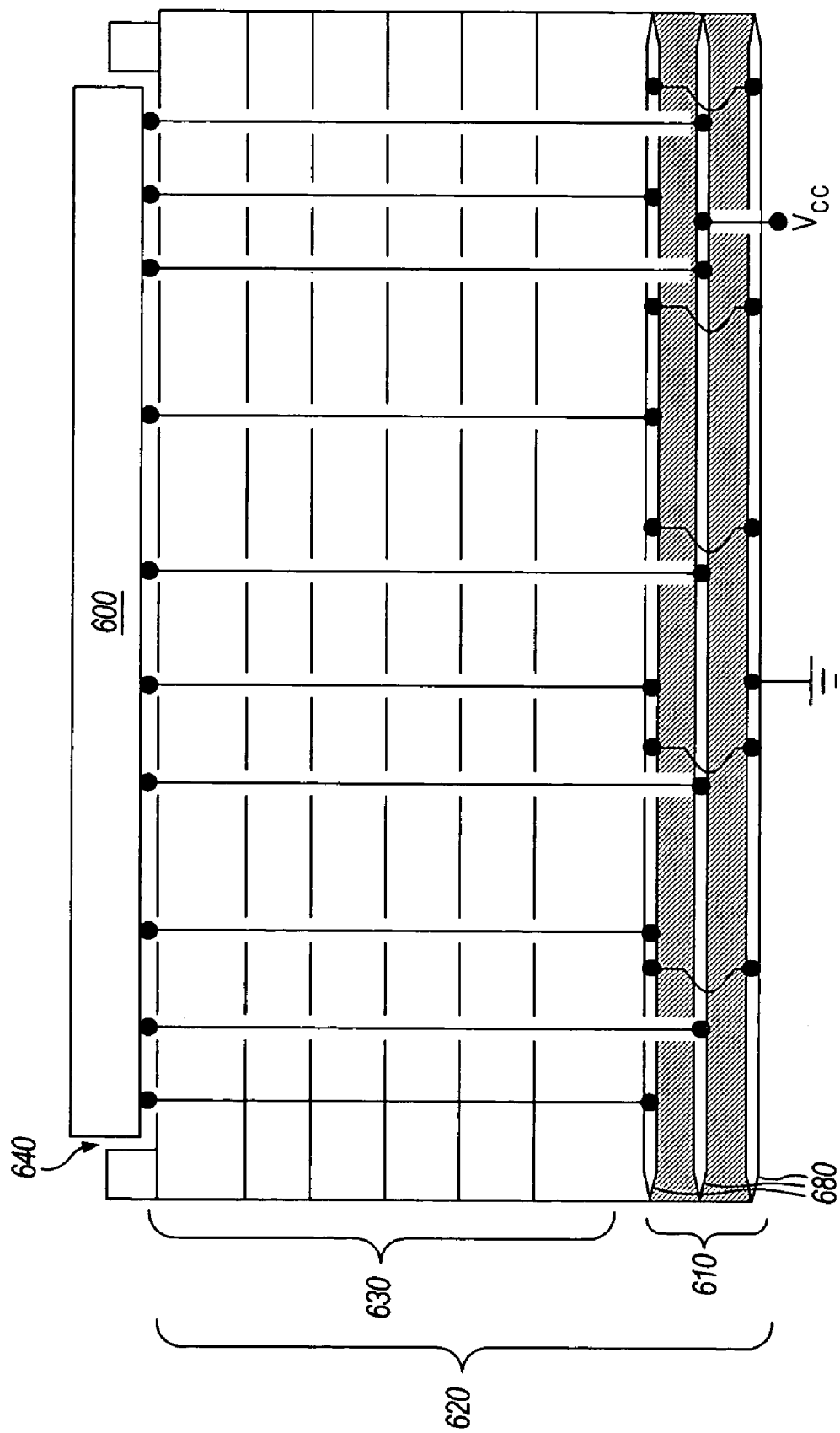

INTEGRAL CHARGE STORAGE BASEMENT AND WIDEBAND EMBEDDED DECOUPLING STRUCTURE FOR INTEGRATED CIRCUIT

BACKGROUND OF THE INVENTION

The design of power distribution decoupling networks has become problematic due to the ever-increasing complexity of electronic circuitry. Power supply distribution on a typical Printed Circuit Board (PCB) is accomplished with an elaborate decoupling network consisting of a multitude of shunt capacitors and series dampening elements. A major concern in modern PCB design is power supply isolation between the various circuits on the PCB. To that end, complex decoupling networks have evolved to minimize direct coupling and Electro-Magnetic-Interference (EMI) between these circuits along the power supply distribution lines. These circuits consist of various bypass capacitors that collectively provide high shunt admittance across all frequencies on the PCB, and series dampening devices which are generally resistors and ferrite beads. Over time these decoupling circuits have become increasingly complex and are projected to become more so as PCB, Integrated Circuit (IC), and other substrate circuitry increases in diversity and bandwidth. The object of the present invention is to provide an elegant comprehensive solution to this problem.

The current popularity of multifunctional, small, thin, and light circuitry on a single board has spurred the need for miniaturization which in turn fuels the desire to eliminate the plethora of bypass capacitors used in both analog and digital circuits. Achieving such a goal would save component and assembly costs, as well as lower failure rates. In analog circuits both low and high frequency components require specialized large and small bypass capacitors, respectively. The mixing of high-power amplifiers, both RF and audio, with low-noise front-end circuitry also increases the number of bypass capacitors required. In the digital world the coexistence of high-speed components (signal processing) and high power (control) circuitry again increases the need for more capacitors.

The design of power distribution decoupling networks is fraught with problems and tradeoffs. First, capacitors are not capable of bypassing both low and high frequencies. The upper frequency is limited by internal resonances in the capacitors themselves. This upper frequency limit can be increased by reducing the capacitance. However as the capacitance decreases so does its admittance, and hence its ability to shunt low frequencies. To remedy this problem, that is, to overcome the bandwidth limitations of a single capacitor, a multitude of elaborate decoupling networks have evolved. The most common decoupling network solution consists of a number of strategically placed capacitors of different values connected in parallel combined with small appropriately placed series damping resistors. Given the need to decouple nearly every major circuit component on a board, and the desire to maximize power delivery efficiently, a complex set of resonances is often introduced as the capacitors interact with each other and the line lengths between them increases. The power distribution network consisting of these capacitors, resistors, and inductive line lengths, is therefore generally underdamped and prone to instabilities which compromise the performance and isolation of the various generally diverse circuits that they feed power to.

Providing adequate bypassing on the multifunctional circuit boards in use today requires many capacitors spread all over the board along with series decoupling resistors and/or lossy ferrite elements. This traditional method of decoupling is power inefficient as well as costly in terms of manufacturing, reliability and board space. Because DC current must travel through the series damping elements, this approach has the additional flaw of wasting power ($I^2R$ losses) in power-distribution circuits. Furthermore, a multitude of capacitors must be purchased, inventoried, and handled, requiring labor and machine time to install them. Once installed, the capacitors contribute to reducing the reliability of the whole assembly tremendously by introducing two solder connections per component (e.g., capacitors and dampening resistors). One of the highest failure mechanisms in a modern surface mount board are stress failures at the solder joints themselves as well as the growing of metallic oxide dendrites between the component solder pads when biased circuit boards are subjected to humid or wet environments. This problem may become worse with the advent of the new "Pb free" solders that manufacturers will be required to use by Jul. 1, 2006.

Even in the best case, where the circuit designers are aware of all the subtleties inherent in a well functioning power supply distribution system, the resulting, often underdamped, decoupling network is a compromise between economy, stability, reliability, and power delivery efficiencies.

In view of the above, it would be desirable to have a single-element capacitor that is integrated into the circuit board that could distribute power, as a power plane, while providing wide-band, resonant free, high shunt admittance everywhere on the circuit board surface. Such a buried capacitor could eliminate most, if not all, discrete bypass capacitors and their associated dampening resistors and ferrite beads. In theory, a large capacitor spread across a printed circuit board or other substrate could provide shunt admittance large enough that other bypass elements would not be necessary. However, internal reflections off the finite boundaries of such a capacitor induce many resonances in its admittance, destroying the decoupling characteristics of the capacitor at its parallel-resonant frequencies, where its admittance is relatively small. Resonances can be sorted into two types, parallel resonances where the admittance is small and the decoupling is poor, and series resonances where the admittance is large and the decoupling is excellent.

The principal requirement for wideband power-plane decoupling is low shunt impedance over the entire frequency range of interest. This is accomplished using charge storage devices using:

materials that exhibit high Q over a wide bandwidth to realize low Effective Series Resistance (ESR) over the entire band;

a large enough capacitance to provide charge storage for the low frequency band edge; and a physical structure that has no in-band resonances.

An additional requirement is to provide sufficient charge storage electrically close to the devices requiring it. In other words, the capacitor must be placed physically close to the devices needing to be decoupled, thereby providing low external inductance and series resistance between the physical charge storage and the circuitry requiring the charge. Whereas using several layers of a circuit board to create a whole board integral capacitor provides charge physically close to the components requiring charge, it does not solve the fundamental resonance problems that limit the upper frequency use of the capacitor.

The origin of the capacitor resonance problem is described below using the most common fundamental capacitor, which is called a parallel plate capacitor. This capacitor consists of parallel electrically conductive plates separated by free space or a dielectric medium. Resonance, in general, occurs when reinforcing in-phase feedback is provided. In this case the capacitor has a resonance at any wavelength λ where constructive feedback occurs. This constructive feedback causes the resonances that limit the upper frequency use of a parallel plate capacitor. The feedback is created by repeated, reinforcing, multiple, low loss edge reflections of laterally flowing Transverse Electric Magnetic (TEM) waves between the parallel plates. These parasitic laterally flowing waves are initiated whenever a pulse of charge is added to or taken from the capacitor. They are initiated at the point in the capacitor where the charge transfer occurs. Each wave travels laterally from its initiation point until it encounters one of the capacitor's highly reflective edges, whereupon the reflected wave continues traveling in the opposite direction until it encounters another reflective edge. The wave continues traveling, bouncing back and forth between edges, creating resonances whenever the round trip for the wave is in phase. These resonances are called "N*λ/2" resonances because they occur when the distance between reflective edges is a multiple number (N) of half (½) wavelengths (λ).

As the capacitor is made larger and larger to extend the low end of the frequency band, the upper frequency limit to the capacitor gets lower and lower as the boundary conditions, within the capacitor, which determine its internal resonances, get electrically further apart. So, once again, while converting several of the board's layers to one large integral capacitor solves the problem of the stored charge being physically far from circuits requiring the charge, it does not address the fundamental self resonance problems that result from attempting to use a single large capacitor physically big enough to be close to all board components and electrically large enough to bypass the lowest frequencies of the wide band circuitry.

As matter of fact, a large in-board capacitor promotes coupling between circuit elements at the frequencies where capacitor resonances occur such that a by passed component sees a parallel resonance where it is attached to the large buried capacitor. The circuit isolation fails at these points, frequently resulting in unacceptable levels of crosstalk and circuit instabilities due to unintended feedback.

Accordingly, a need exists for a charge delivery source implemented integral to an integrated circuit device (such as the integrated circuit die, the integrated circuit package, the printed circuit board, or the circuit substrate) that can deliver charge over a wide band of frequencies without inducing resonances due to the internal reflections of laterally flowing traveling waves. A need also exists for a wide-band, both low- and high-frequency charge delivery source that provides a reliable, low-inductance, low-impedance return (e.g., a ground return) to electronic components on the integrated circuit device. Furthermore, a need exists for a non-resonant, wide-band, high shunt admittance DC power plane that is available everywhere to the surface of a circuit substrate.

Additionally, a need exists for a wideband capacitor that can be mounted to a circuit board whose upper frequency limit has been increased because the capacitor's naturally occurring resonances have been eliminated without compromising the Q of the capacitor at any frequency.

Finally, a need exists for an integrated capacitive structure that replaces most, if not all, bypass capacitors on a chip and/or board, thereby greatly reducing the part count on all circuits in which it is implemented and decreasing the size of the chip and/or board.

SUMMARY OF THE INVENTION

The present invention is a capacitive structure and technique for allowing near-instantaneous charge transport and reliable, wide-band RF ground paths in integrated circuit devices such as integrated circuit dies, integrated circuit packages, printed circuit boards, and electronic circuit substrates.

A basic premise of this invention is that the upper frequency limit of a capacitor can be eliminated or greatly extended by any and all means of suppressing these lateral resonances by implementation of a loss mechanism that does not substantially increase the Effective Series Resistance (ESR) of the capacitor. It is appreciated that there are many ways to do this. In this invention the concept of "perimeter absorption" is introduced to facilitate the creation of integrated structures that absorb the capacitor's internal laterally flowing Electro-Magnetic (E&M) waves. (The waves will usually be a subclass of these E&M waves called Transverse Electric Magnetic (TEM) waves, and so throughout this document the laterally flowing waves will be referred to as TEM waves without lack of generality.) However methods of interrupting or dampening these waves throughout the capacitor are also appreciated. Similar structures that are later shown in this invention for edge dampening can also be used throughout the capacitor but are not the preferred embodiment as they may increase the ESR of the capacitor at some or all frequencies.

A lossy signal absorption ring structure is implemented, preferably at the capacitor's perimeter, to eliminate or greatly reduce the edge reflection and thereby eliminate or greatly reduce the resonances that determine the upper frequency limit of the capacitor's use. The perimeter loss function can be accomplished by any and all combination of the four absorptive modes: conductive loss, dielectric loss, magnetic loss, and radiative loss. Also, the perimeter loss function can be accomplished using a continuous or discontinuous ring of absorptive material. The lossy material can be patterned in discontinuous pieces. While in the preferred embodiment the lossy material is formed as a continuous ring, it in fact can be implemented as discrete lossy chunks scattered in a pattern to obtain the desired perimeter loss function. The idea is to absorb the laterally flowing waves without impeding the supply of charge to the components the device is designed to supply charge for, and any means of achieving the absorption is acceptable. This includes the following methods but does not preclude other methods: adding or taking away material, or converting the properties of materials so that they selectively become absorptive in a pattern that absorbs the laterally flowing waves while minimizing any restriction of the charge flow vertically out of or into the charge storage device. This pattern could be anywhere within the volume of the charge storage device and is not limited to the physical perimeter of a layer. What is shown in the detailed description and drawings as examples of this invention are just that. They are examples of patterned lossy material that dampen the laterally flowing waves that create resonances which limit the upper frequency usefulness of capacitors without interfering with charge transport to the external circuitry from and to these capacitors. Basically this pattern of lossy material is designed to inhibit the ebb and flow of the charge within the capacitor without interfering with the ability to move charge in and out of the capacitor. For this reason, the loss generally (but not always) appears at the physical perimeter of the CSB where the reflections take place. The invention includes all methods, and materials of obtain a loss pattern within a capacitor that inhibits the lateral flowing waves induced within a capacitor whenever charge is added or removed while minimizing the restriction of charge transport in and out of the capacitor itself. The exact loss pattern can also be tailored for specific applications and specific placement of parts. Additional isolation can be provided between individual circuits by implementing a respective signal absorption ring around each circuit that needs additional isolation In implementation, an integrated circuit device includes an integral set of high-dielectric layers interleaved with highly-conductive layers, with at least one signal absorption ring implemented on or in at least one of the conductive and/or dielectric layers. The signal absorption ring operates to dampen lateral traveling waves generated in the structure so as to eliminate or at least substantially mitigate the resonant frequency limitations of the plate capacitor formed by the structure.

The structure of integral charge storage layers with signal absorption ring(s) (termed herein "charge storage basement" or "CSB") provides near-instantaneous charge delivery and good wide-band RF shorts, that is high wide-band shunt admittance, at any point on the surface of any substrate containing a CSB. In the context of the present invention, a "good" RF short (1) is non-resonant (i.e. does not become inductive or open at certain frequencies), (2) has low RF impedance, and 3) the charge is stored physically and electrically close to the capacitor terminal where the charge is to be accessed. The availability of near-instantaneous charge delivery and good wide-band RF shorts anywhere on the substrate of the integrated circuit or chip package allows for the development of greatly simplified circuits with fewer parts and therefore greater robustness, lower manufacturing costs, and faster design time. The predictability of the CSB to provide wide-band (simultaneous high and low frequencies) shunt admittance anywhere on the IC's/PCB's/(any other substrate's) surface significantly contributes to electronic circuit development in a single prototype cycle, drastically reducing time-to-market.

It is appreciated that CSB implementation is not limited to a "whole board/substrate" use, and that it can also be implemented piece meal in any area/area's of the substrate desired. In this partial board area implementation all of the virtues of the CSB are retained in the area's in which it is implemented. Also, it is possible to implement a CSB to distribute power from one source in one section of the substrate, and implement a second CSB to distribute power from another source in the same section or an entirely different section. This may be done, for example to distribute the several voltage supplies frequently required in today's diverse circuitry.

In one preferred embodiment of the CSB of the invention, at least one of the conductive layers is connected to a power source and operates as a power plane, while at least one other of the conductive layers is connected to the circuit/chip/board ground and operates as a ground plane. The signal absorption ring(s) are preferably implemented at the outside edge of the layer(s) and/or circuitry to be isolated and surrounds the internal useful area of the power and/or ground layer(s) where charge storage and power supply decoupling takes place. Ideally the signal absorption ring(s) absorb all or most of the energy of any waves generated within the CSB, thereby eliminating or substantially mitigating the $N\lambda/2$ resonances that would otherwise limit the upper frequency of the buried capacitor.

In practice the power of a wave reflected from the CSB edge need only be reduced by 10:1 to form a 10 db return loss from its first edge reflection. This means we have 20 db of loss in two bounces which would greatly reduce the capacitor's resonances, and would effectively remove the upper frequency limitation for the capacitor in most practical applications.

BRIEF DESCRIPTION OF THE DRAWINGS

FIG. 7A is a plot of resistance versus distance illustrating a discrete version of the preferred resistive profile of FIG. 5A for a signal absorption ring on lateral waves generated in the CSB;

FIG. 7B is the corresponding waveform diagram illustrating the effect of the signal absorption ring characterized by the resistive profile shown in FIG. 7A;

FIG. 8A is a plot of resistance versus distance illustrating a resistive profile for a signal absorption ring having a single resistive step;

FIG. 8B is the corresponding waveform diagram illustrating the effect of the signal absorption ring characterized by the resistive profile shown in FIG. 8A;

FIG. 13A is a side cross-sectional view of a single-sided integrated circuit device implementing a CSB in accordance with the invention and which allows circuit isolation using different power sources;

FIG. 16 is a side cross-sectional view of an integrated circuit illustrating a variation of the CSB technique for achieving isolation of circuits;

DETAILED DESCRIPTION

Figure 1:
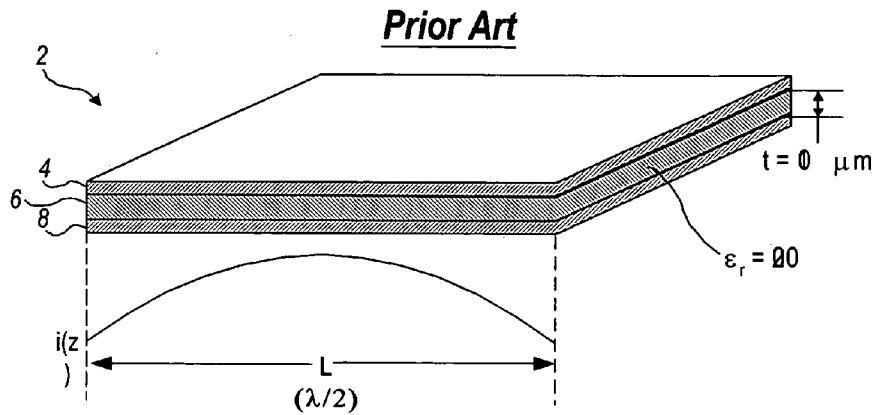
FIG. 1 is a perspective view of a conventional parallel plate capacitor along with a corresponding graph of the current distribution for the lowest-order resonance of the capacitor.

In order to more fully understand the present invention, we turn now to consider the prior art parallel plate capacitor structure 2 diagrammed in FIG. 1. The structure 2 is formed with a dielectric 6 sandwiched between two conductive plates 4 and 8 at different voltage potentials (e.g., $V_{CC}$ and ground, respectively). The structure 2 exhibits resonances due to waves that move laterally in the capacitor and that are reinforced by multiple reflections off the edges of the capacitor at frequencies where the path length (L) is a multiple (N) of a half (½) of a wavelength, λ—that is, L=Nλ/2. The first resonance, $f_1$, occurs at the frequency where the capacitor is half a wavelength (λ/2) long. Additional resonances occur whenever the length is an integer (N) multiple of λ/2, giving the frequency of the Nth resonance, $f_N$, as $$f_N = \frac{N}{2} \frac{c}{L\sqrt{\varepsilon_r}} \quad (1)$$

where $\varepsilon_r$ is the relative dielectric constant of the material of the dielectric 6 separating the plates 2 and 4 of the capacitor and c is the speed of light in a vacuum. Depending on the driving point, other resonant modes may also arise.

Turning now to the invention, to create a practical, whole-board, integral capacitor it is necessary to effectively dampen the internal resonances of a generalized capacitor. The invention requires implementation of a signal absorption mechanism that operates to dampen or absorb the laterally flowing waves in the capacitor without impeding the supply of charge to the components the device is designed to supply charge for. In accordance with the invention, any means of achieving the dampening or absorption is acceptable, including all methods and/or materials of generating a loss function within the capacitor that inhibits the lateral flowing waves induced within the capacitor whenever charge is added to or removed from the capacitor while minimizing the restriction of charge transport in and out of the capacitor itself.

Figure 2A:
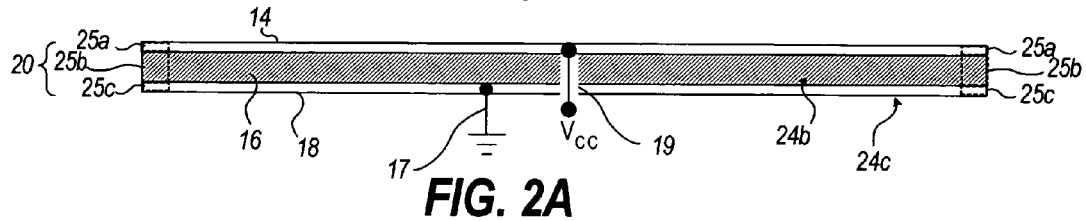
FIG. 2A is a side cross-sectional view of a capacitor implemented in accordance with the principles of the invention.
Figure 2B:
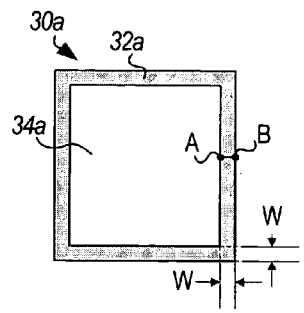
FIG. 2B is a top plan view of at least one of the layers of the capacitor of FIG. 2A in which a perimeter absorption ring is illustrated.

FIG. 2A is a side cross-sectional view, and FIG. 2B is a top plan view, of a preferred embodiment of a capacitor 20 implemented in accordance with the principles of the invention. As shown, the invention is a capacitor 20 having at least two conductive layers 14, 18, each interleaved by a dielectric layer 16. At least one layer 14, 16, 18 is implemented with a signal absorption mechanism 25a, 25b, and/or 25c for dampening laterally flowing Transverse Electric Magnetic (TEM) waves between the conductive layers 14, 16. The signal absorption mechanism 25a, 25b, and/or 25c introduces loss into the capacitor 20 in the form of one or more of resistive loss, conductive loss, dielectric loss, magnetic loss, and radiation loss. In the preferred embodiment, the signal absorption mechanism 25a, 25b, and/or 25c is a signal absorption ring (shown as 32a in FIG. 2B) formed at the outer perimeter of one or more of the capacitor layers 14, 16, 18 (shown as 30a in FIG. 2B) which bounds a non-absorptive area 24a, 24b, and/or 24c (shown as 34a in FIG. 2B) to which the capacitor terminals are coupled. As used herein, a signal absorption ring refers to a generally circumferential discrete or continuous boundary of any shape and size, wherein the boundary implements a signal absorption function and includes a non-absorptive area within the circumference of the boundary.

Figure 3:
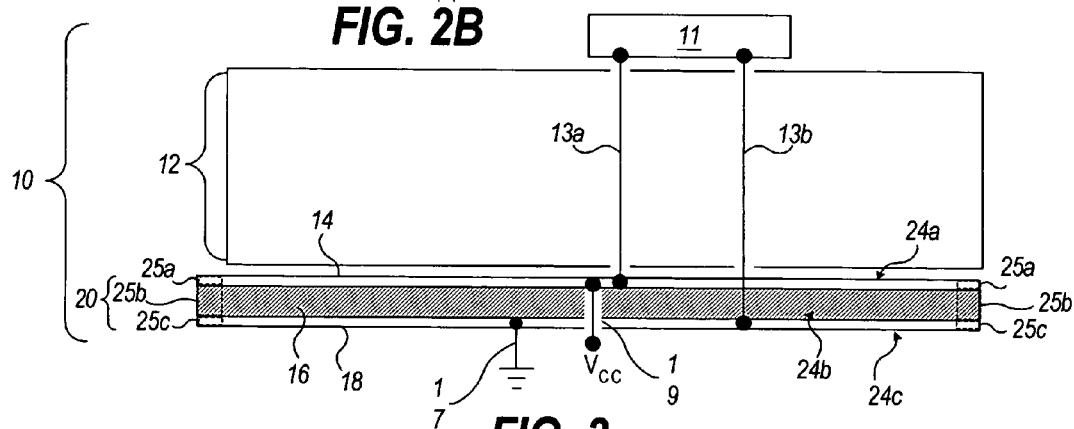
FIG. 3 is a side cross-sectional view of a an integrated circuit device illustrating an example general application of the invention.

FIG. 3 is a side cross-sectional view of a preferred general application which utilizes the capacitor of the invention. As shown, the capacitor is essentially a buried capacitor (herein called a "charge storage basement", or "CSB") 20 for an integrated circuit device 10 comprising an electrical component 11 such as an integrated circuit, a signal interconnect stack 12, and the CSB 20 of the invention. The signal interconnect stack 12 includes a plurality of interleaved conductive and dielectric layers that route signals between terminals of electronic components (e.g., component 11) mounted thereon. The CSB 20 comprises at least two conductive layers 14 and 18 separated by a dielectric layer 16 wherein one or more of the two conductive layers 14, 18 and dielectric layer 16 implements a respective signal absorption ring 25a, 25b, 25c that bounds a corresponding respective non-absorptive area 24a, 24b, 24c on the respective layer 14, 16, 18. One of the conductive layers 14 is connected to a power source 19 and serves as a power plane, and the other conductive layer is 18 is connected to ground 17 and serves as a ground plane. The electronic component 11 connects to the power plane 14 by way of a conductive path 13a through the signal interconnect stack 12 (e.g. by way of vias and traces), and to the ground plane 18 by way of an alternate conductive path 13b.

Figure 4A:
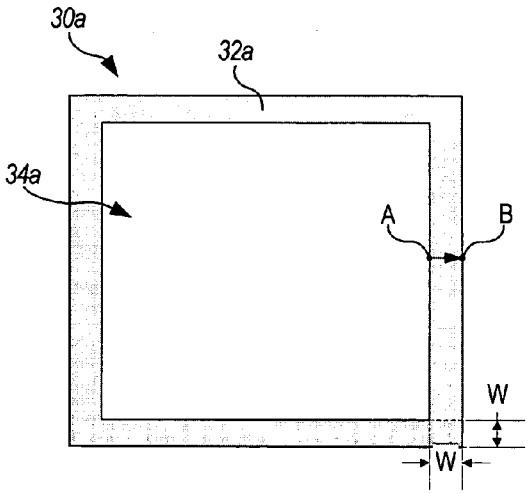
FIGS. 4A, 4B, and 4C are plan views illustrating example layouts for a CSB layer that implements a continuous signal absorption ring.
Figure 4B:
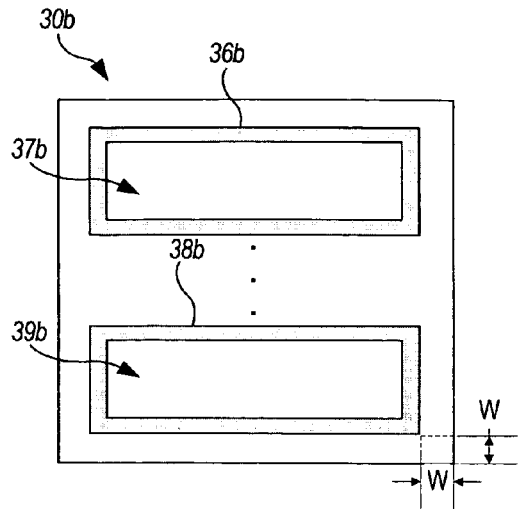
Figure 4C:
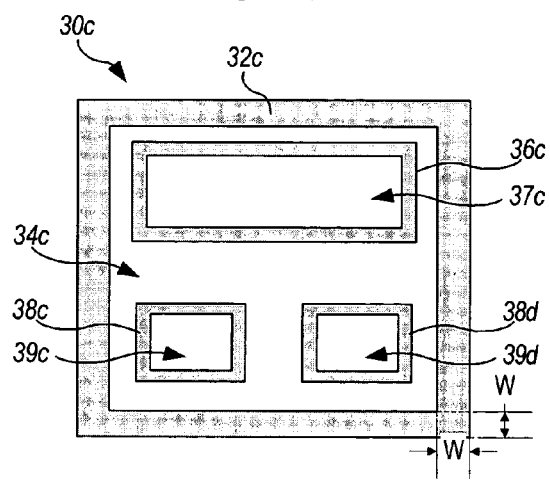

FIGS. 4A, 4B, and 4C are plan views illustrating example layouts for a CSB layer that implements a signal absorption ring. As illustrated, in each layout, the signal absorption ring bounds a non-absorptive (i.e., substantially non-lossy) area of the layer on which it is implemented.

In the first layout shown in FIG. 4A, the signal absorption ring 32a is implemented at the outer perimeter of the layer 30a and surrounds a non-absorptive area 34a. The signal absorption ring 32a attenuates the resonances initiated in the non-absorptive area 34a by reducing the reflections at the boundary edges of the substrate or board by means discussed hereinafter with respect to FIGS. 9A through 9I.

It will be appreciated that implementation of the signal absorption ring is not limited to the outer perimeter of the layer, but can be implemented anywhere on the CSB layer. For example, in the layout shown in FIG. 4B, one or more signal absorption rings 36b, 38b are implemented, but not necessarily at the perimeter of the layer 30b. However, it will be appreciated that the effectiveness of the signal absorption ring for eliminating resonances when not implemented at the outer perimeter of the layer 30b is limited to devices connected to the area(s) 37b, 39b bounded by the respective signal absorption ring 36b, 38b. Further, additional signal absorption rings may be similarly implemented in a single layer.

Other layouts are possible. For example, signal absorption rings may be implemented within areas bounded by other signal absorption rings. FIG. 4C, for example, illustrates a layout that implements a signal absorption ring 32c at the outer perimeter of the layer 30c and one or more signal absorption rings 36c, 38c, 38d implemented within the area 34c bounded by the first signal absorption ring 32c. The inner signal absorption rings 36c, 38c, 38d may be implemented, for example, to provide isolation between components connected within the respective inner bounded areas 37c, 39c, 39d from components connected to the first bounded area 34c outside of the respective inner signal absorption rings 36c, 38c, 38d or within other bounded areas, as discussed hereinafter.

Figure 4D:
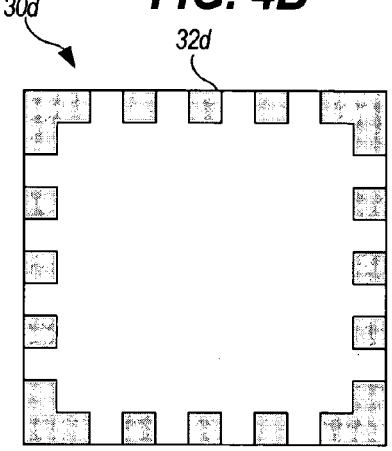
FIG. 4D is a plan view illustrating an example layout for a CSB layer that implements a signal absorption mechanism implemented using an alternative pattern.
Figure 4E:
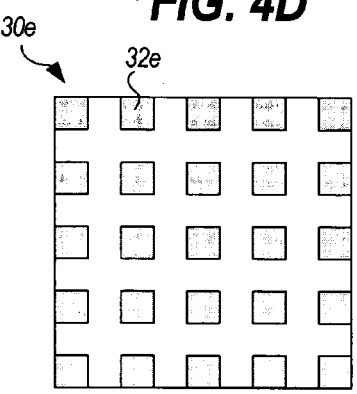
FIG. 4E is a plan view illustrating an example layout for a CSB layer that implements a signal absorption mechanism implemented using another alternative pattern.

Although in the preferred embodiment the signal absorption mechanism is implemented as a signal absorption ring according to the definition given above, the signal absorption mechanism used may not even be in the form of a "ring". In some embodiments, the signal absorption mechanism may be implemented using a pattern that does not form a circumferential boundary. For example, FIG. 4D illustrates a layout of a CSB layer 30d that implements a plurality of signal absorption areas 32d discretely situated around the edges of the capacitor. Each of the signal absorption areas 32d operates to dampen laterally traveling waves generated in the non-absorptive area of the CSB. In another example, FIG. 4E illustrates a layout for a CSB layer 30e that implements a plurality of signal absorption areas 32e according to a "waffle" pattern. The layout pattern chosen may vary from implementation to implementation and should be designed to meet the frequency requirements of the particular circuits that the CSB is to supply charge to.

Turning now to the details of the signal absorption ring(s), a given signal absorption ring 32a, 32c, 36b, 38b, 36c, 38c, 38d or signal absorption mechanism 32d, 32e may be implemented in a number of ways, as discussed in detail hereinafter with respect to FIGS. 9A through 9I. However, common to all implementations is the resulting signal dampening property that dampens/prevents reflections of signals flowing laterally within the CSB. Inherent in this property is that resistive discontinuities should be avoided or minimized as much as possible, and the resistive profile of the signal absorption ring preferably generally increase as signals travel into the ring.

Figures 5A, 5B:
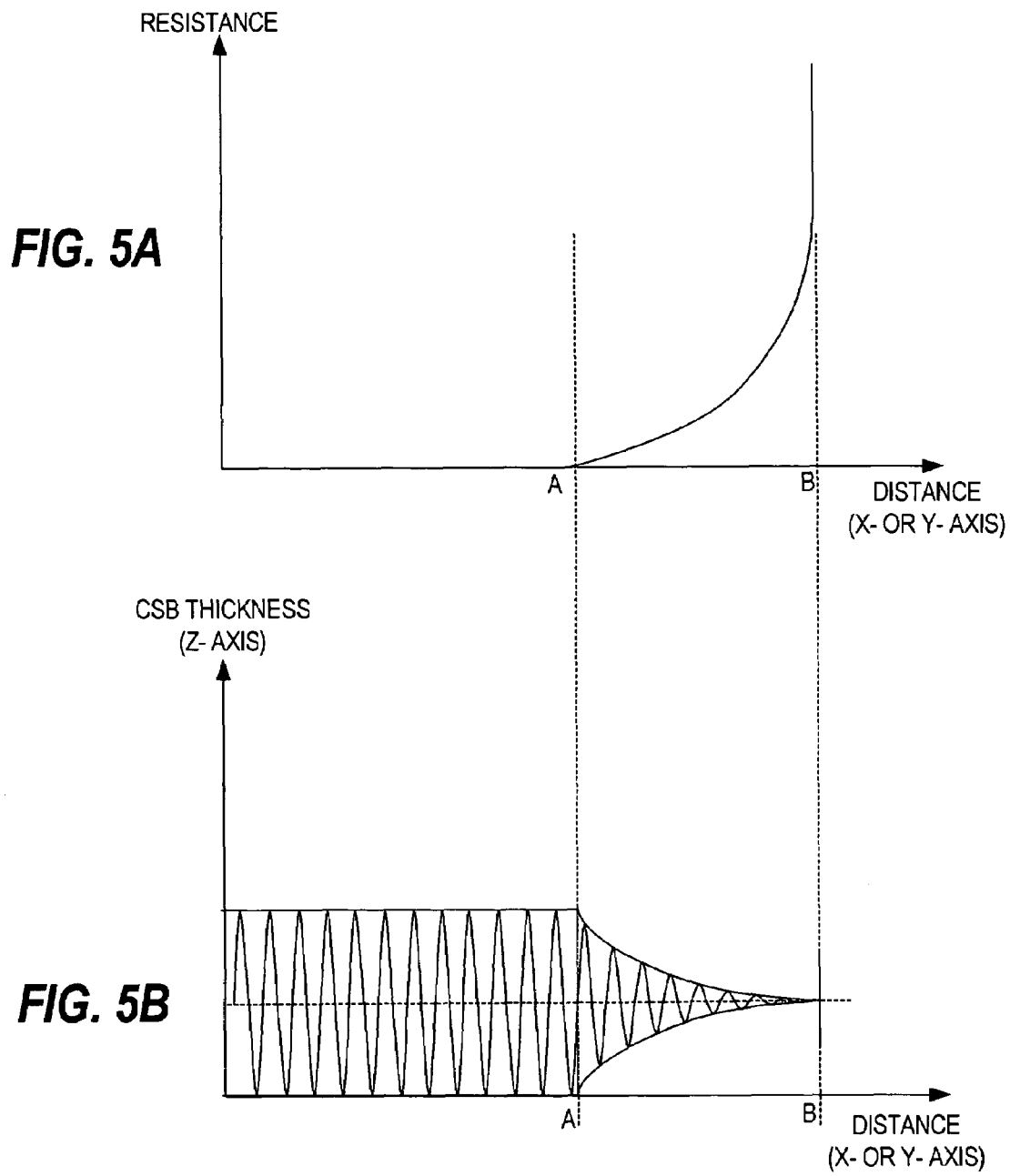
FIG. 5A is a plot of a preferred resistive profile for an example signal absorption ring.
FIG. 5B is the corresponding waveform diagram illustrating the effect of the signal absorption ring characterized by the resistive profile shown in FIG. 4A on lateral waves generated in the CSB.

FIG. 5A is a plot of resistance versus distance illustrating one example of a preferred resistive profile for a signal absorption ring (for example 32a of layer 30a shown in FIG. 4A), and FIG. 5B is the corresponding waveform diagram illustrating the effect of the signal absorption ring on lateral waves generated in the non-absorptive area (for example 34a of FIG. 4A) of the CSB. As shown in this example, the resistive profile is a continuous exponential function that exponentially increases in resistivity the further the wave travels into the signal absorption ring (from point to A to point B), thereby dampening the wave preferably to the point of extinguishing it.

Figures 6A, 6B:
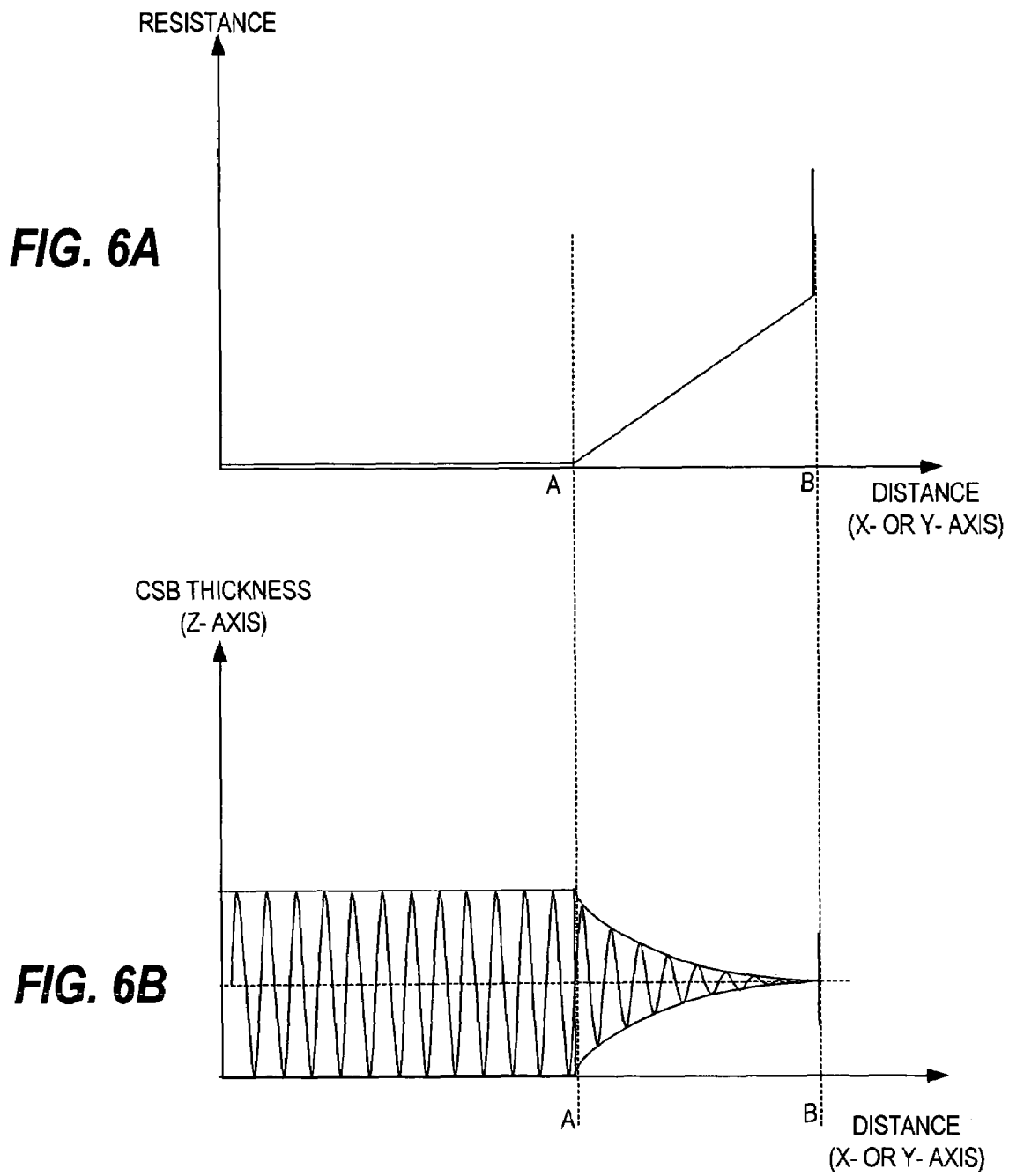
FIG. 6A is a plot of a preferred resistive profile for another example signal absorption ring.
FIG. 6B is the corresponding waveform diagram illustrating the effect of the signal absorption ring characterized by the resistive profile shown in FIG. 5A on lateral waves generated in the CSB.

FIG. 6A is a plot of resistance versus distance illustrating another example of a preferred resistive profile for a signal absorption ring (for example 32a of the CBS layer 30a shown in FIG. 4A), and FIG. 6B is the corresponding waveform diagram illustrating the effect of the signal absorption ring on lateral waves generated in the non-absorptive area (for example 34a of FIG. 4A) of the CSB. As shown in this example, the resistive profile is a continuous linear function that linearly increases in resistivity the further the wave travels into the signal absorption ring (from point to A to point B), again, preferably dampening the wave to the point of extinction. As illustrated, the rate of dampening is dependent on the slope of the resistive profile line.

A resistive profile implementing a continuous function, such as those shown in FIGS. 5A and 6A, is preferred because in such an embodiment, the wave does not encounter any electrical discontinuities that might result in undamped signal reflections. However, the resistive profiles of FIGS. 4A and 5A (and other continuous functions) can be approximated using step functions (for example, if required due to manufacturing limitations as discussed hereinafter). If implemented discretely, however, the size of each increment (in terms of change in electrical properties) should be as small as possible to minimize the magnitude of the electrical discontinuities between each step since, as described previously, electrical discontinuities may result in signal reflections. For example, FIG. 7A is a plot of resistance versus distance illustrating a discrete version of the preferred resistive profile of FIG. 5A for a signal absorption ring, and FIG. 7B is the corresponding waveform diagram illustrating the effect of the signal absorption ring on lateral waves generated in the non-absorptive area of the CSB. As shown in this example, the resistive profile is a discrete exponential function having small incremental steps that increase in resistivity the further the wave travels into the signal absorption ring (from point A to point B), preferably dampening the wave to the point of practical extinction.

Although it is preferred to implement a discrete resistive profile function using multiple increments (in terms of electrical characteristics), a signal absorption ring can in fact actually be implemented using a single absorptive step. FIG. 8A is a plot of resistance versus distance illustrating a resistive profile comprising a single step function for a signal absorption ring, and FIG. 8B is the corresponding waveform diagram illustrating the effect of the signal absorption ring on lateral waves generated in the non-absorptive area of the CSB. As shown in this example, waves traveling into the signal absorption ring are still dampened at an exponential rate of decay.

Figure 9A:
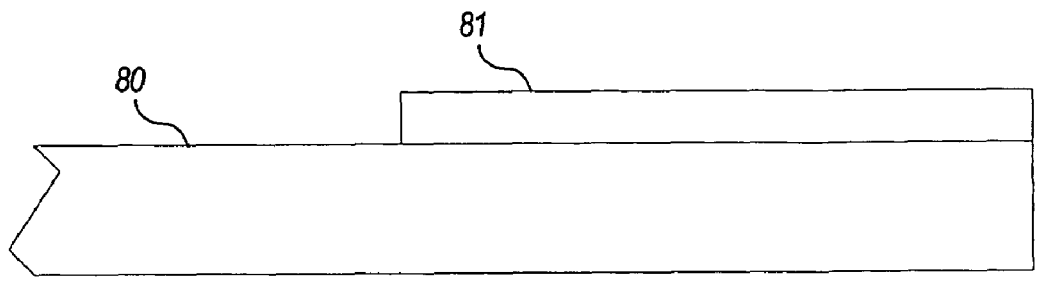
FIGS. 9A-9I are cross-sectional side views of CSB layers implementing signal absorption rings with corresponding cross-sectional top views of portions of the signal absorption rings.
Figure 9B:
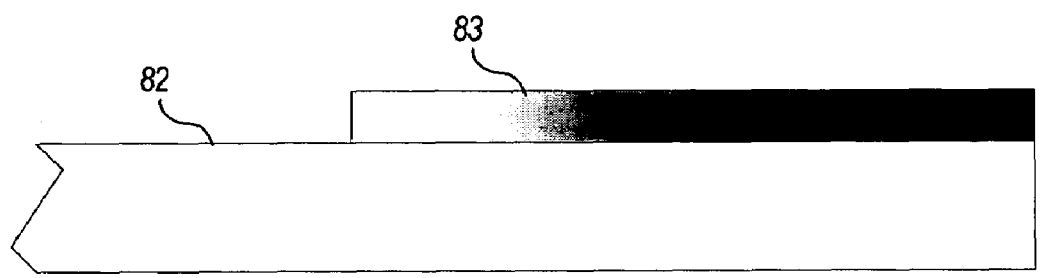
Figure 9C:
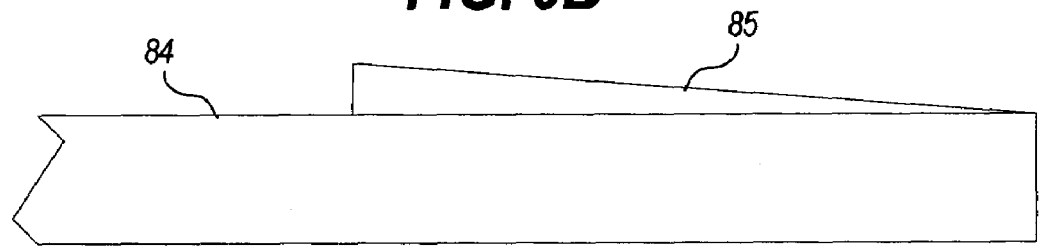
Figure 9D:
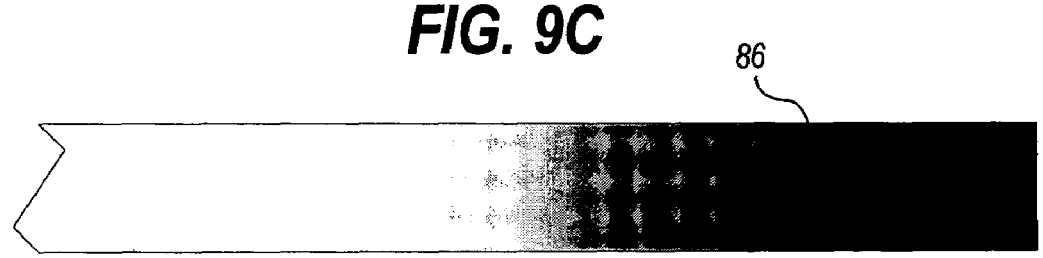
Figure 9E:
Figure 9F:
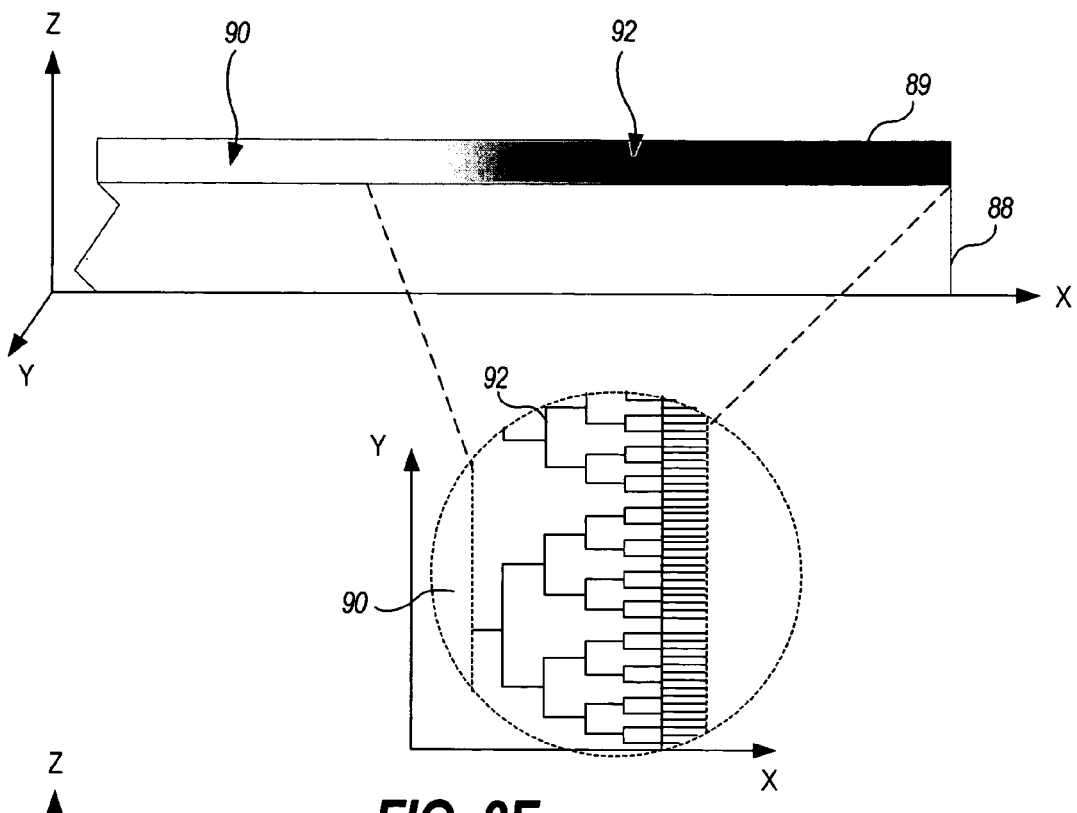
Figure 9G:
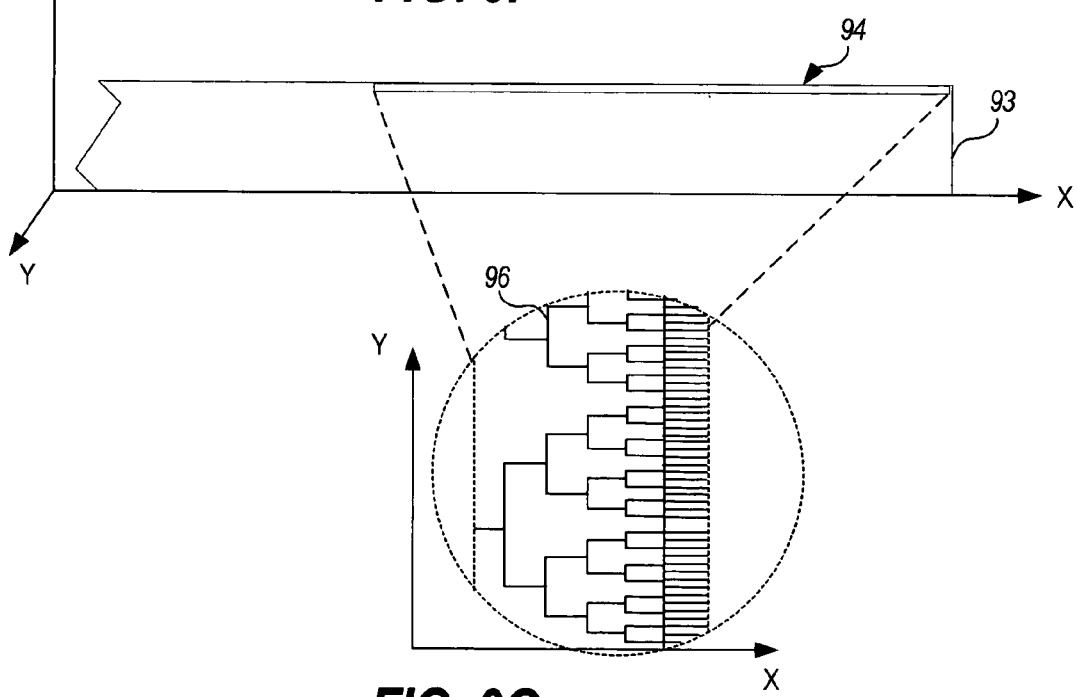
Figure 9H:
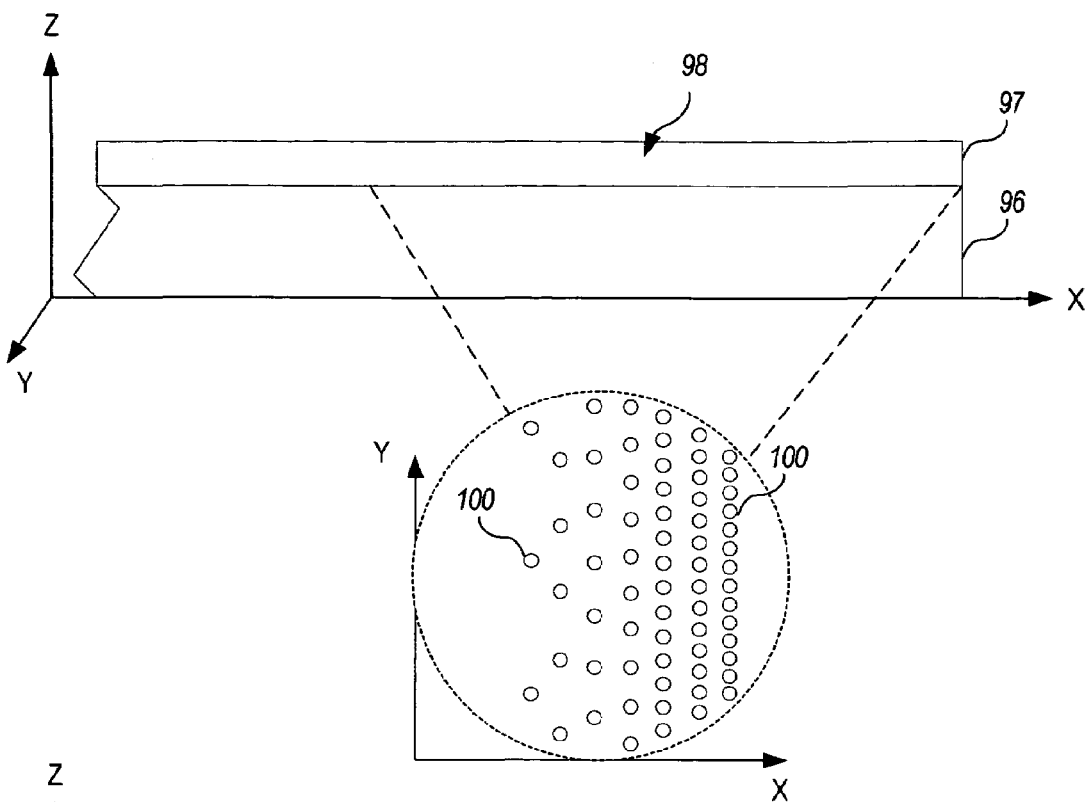
Figure 9I:
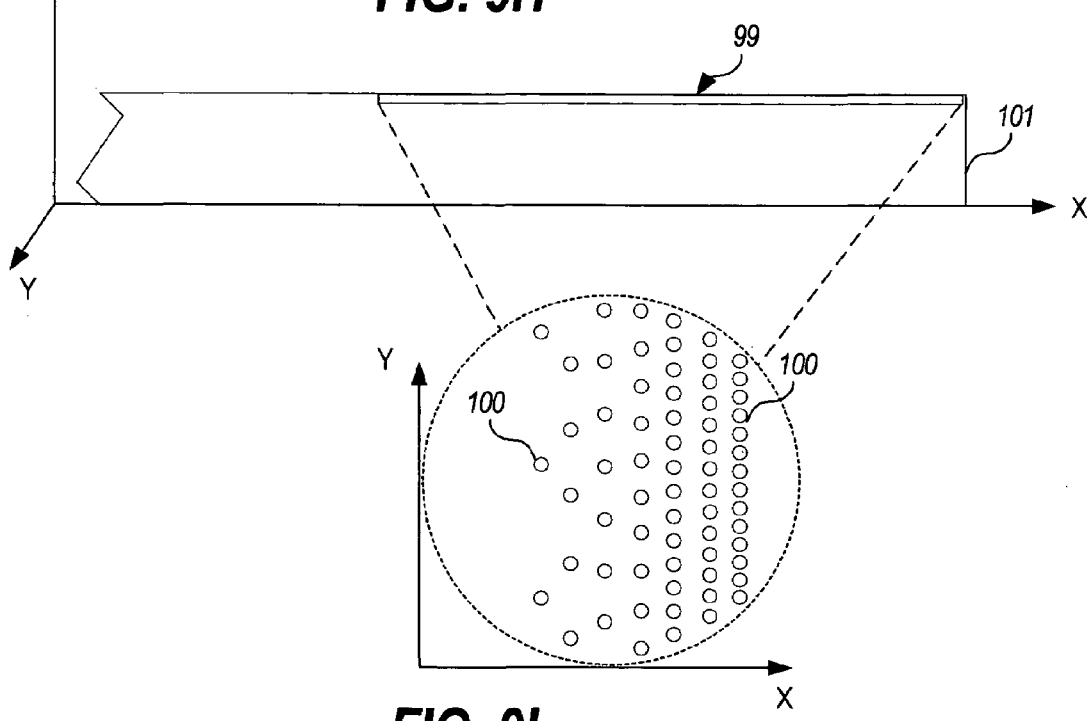

As mentioned previously, there are many different techniques for implementing a signal absorption ring with a desired resistive profile. FIGS. 9A through 9I illustrate some of the many techniques, including adding lossy material to a CSB layer or altering the characteristics of the CSB layer itself to become lossy in the area of the signal absorption ring. Various methods for introducing lossy signal absorption mechanisms include:

a. Adding lossy material 81 to the layer 80, as shown in FIG. 9A. Depending on the underlying layer 80 (conductive or dielectric), the lossy material 81 may introduce resistive, conductive, magnetic, dielectric, and/or radiation loss. The lossy material 81 can be characterized by a resistive profile that is either a continuous function (as shown in FIGS. 5A and 6A) or can be a discrete function (as shown in FIGS. 7A and 8A. The lossy material 81 may be formed by "growing" a resistive oxide on the conductive layer(s), printing, laminating, or otherwise applying lossy material to achieve the desired resistive profile.

b. Adding lossy material 83 to the layer 82, as shown in FIG. 9B. Depending on the underlying layer 82 (conductive or dielectric), the lossy material 83 may introduce resistive, conductive, magnetic, dielectric, and/or radiation loss. The lossy material 83 can be characterized by a resistive profile that is either a continuous function (as shown in FIGS. 5A and 6A) or can be a discrete function (as shown in FIGS. 7A and 8A, and is achieved by increasing the density of the lossy material. The lossy material 83 may be formed by "growing" a resistive oxide on the conductive layer(s), printing, laminating, or otherwise applying lossy material to achieve the desired resistive profile.

c. Adding lossy material 85 to the layer 84, as shown in FIG. 9C. Depending on the underlying layer 84 (conductive or dielectric), the lossy material 85 may introduce resistive, conductive, magnetic, dielectric, and/or radiation loss. The lossy material 85 can be characterized by a resistive profile that is either a continuous function (as shown in FIGS. 5A and 6A) or can be a discrete function (as shown in FIGS. 7A and 8A, and is achieved by decreasing the thickness of the lossy material. The lossy material 85 may be formed by "growing" a resistive oxide on the conductive layer(s), printing, laminating, or otherwise applying lossy material to achieve the desired resistive profile.

d. Altering the composition of the material of the layer 86 in the region of the signal absorption ring, as shown in FIG. 9D, for example by adding impurities with increasing density of lossy material to achieve the desired resistive profile.

e. Gradually thinning the material of the layer(s) 87 to achieve higher resistivity, as shown in FIG. 9E.

f. Applying increasingly denser patterns 92 of a lossy material 89 to the surface(s) of the layer(s) 88 in the signal absorption ring 92, as shown in FIG. 9F. (Note: there is no lossy material 89 in the region of non-absorptive area 90).

g. Etching increasingly dense patterns 96 in the surface(s) of the layer(s) 93, as shown in FIG. 9G. Such patterns ideally would create isolated areas of conductivity that become gradually sparser toward the outer perimeter of the signal absorption ring 94. In this embodiment, the signal absorption ring 94 is etched or otherwise formed with a fractal pattern that begins near the inner perimeter of the signal absorption ring 94 and gradually increases as it approaches the outer perimeter of the signal absorption ring 94. The etched lines 96 on the conductive layer 93 operate as an electrical open or a high-resistance barrier, and therefore operate to increase the resistivity of the conductive material as the number of etched lines 96 is increased. Etched fractal patterns other than that illustrated may also achieve similar results.

h. Creating holes 100 in a layer 97 of material on the surface of the layer(s) 96 in a pattern within the signal absorption ring 98 that becomes more dense with holes (or other patterns) for higher resistivity, as shown in FIG. 9H. The holes 100 operate as an electrical open, and therefore increase the resistivity of the conductive material as the number of holes 100 is increased. In this embodiment, the number of holes 100 is few near the inner perimeter of the signal absorption ring 98 and gradually increases as it approaches the outer perimeter of the signal absorption ring 98.

i. Creating holes 100 in the material of the layer(s) 101 in a pattern that becomes more dense with holes (or other patterns) for higher resistivity, as shown for the signal absorption ring 99 in FIG. 9I.

j. Any combination of methods a through h.

Preferably, a signal absorption ring should have at least approximately 5 dB of loss from the inner perimeter of the ring to the outer perimeter of the ring over the potential resonant frequencies. In general, this means to set 5 dB of loss at the first resonant frequency, because as the frequency increases, the loss is greater. A 5 dB signal absorption ring loss corresponds to approximately 10 dB of return loss, which is known to dampen out the resonance.

Figure 10A:
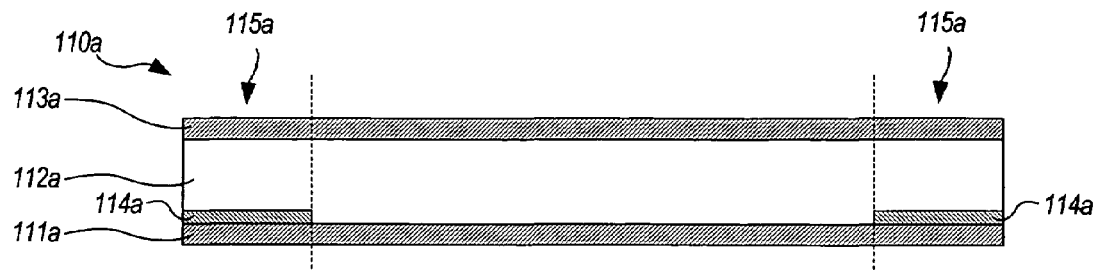
FIG. 10A is a cross-sectional side view of a CSB with a signal absorption ring implemented on a top surface of one of the conductive layers.

Each of the above example implementations may be implemented on any one of the CSB layers, including one or both of the conductive layers and/or the dielectric layer. For example, FIG. 10A illustrates a CSB 110*a* with a signal absorption ring 115*a* implemented according to the method shown in FIG. 9A on the inside surface (facing the dielectric 112) of one of the conductive layers 111*a*. To this end, a resistive material 114*a* is formed on the conductive layer 111*a* within the area defined by the signal absorption ring 115*a*.

Figure 10B:
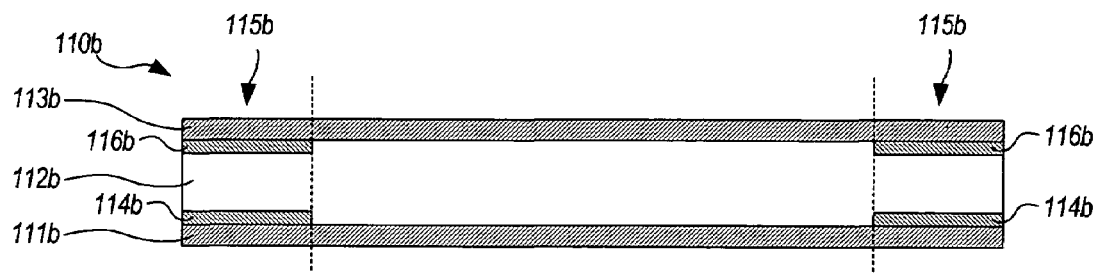
FIG. 10B is a cross-sectional side view of a CSB with a signal absorption ring implemented on a top surface of one of the conductive layers and on a bottom surface of one of the conductive layers.

FIG. 10B shows a CSB 110*b* with a signal absorption ring 115*b* implemented according to the method shown in FIG. 9A on the inside surfaces (facing the dielectric 112*b*) of both of the conductive layers 111*b* and 113*b*. To this end, a resistive material 114*b* formed on the conductive layer 111*b* within the area defined by the signal absorption ring 115*b*, and a resistive material 116*b* is formed on the inside surface of the conductive layer 113*b* within the area defined by the signal absorption ring 115*b*.

Figure 10C:
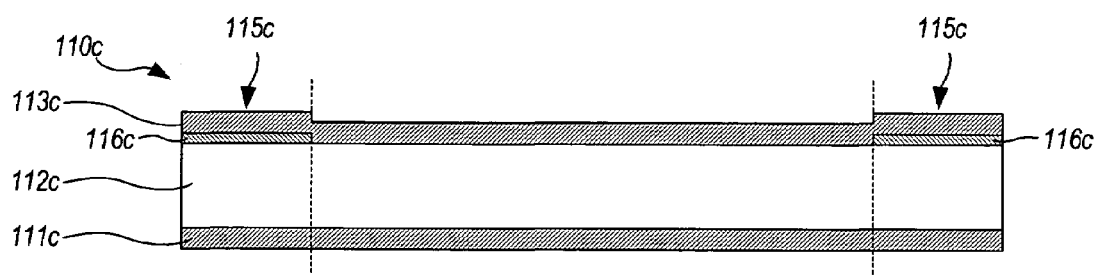
FIG. 10C is a cross-sectional side view of a CSB with a signal absorption ring implemented on one surface of a dielectric layer.

FIG. 10C illustrates a CSB 110*c* with a signal absorption ring 115*c* implemented according to the method shown in FIG. 9A on one surface (facing the conductive layer 113*c*) of the dielectric layer 112*c*. To this end, a resistive material 116*c* is formed on the dielectric layer 112*c* within the area defined by the signal absorption ring 115*c*.

Figure 10D:
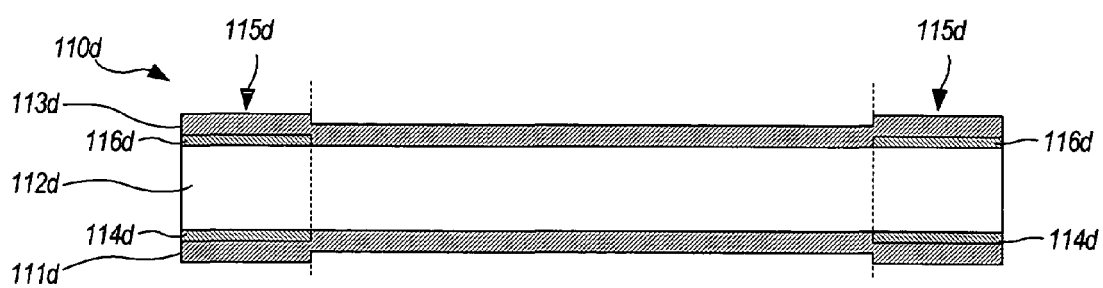
FIG. 10D is a cross-sectional side view of a CSB with a signal absorption ring implemented on both surfaces of the dielectric layer.

FIG. 10D shows a CSB 110*d* with a signal absorption ring 115*d* implemented according to the method shown in FIG. 9A on both surfaces (facing the conductive layers 111*d* and 113*d*) of the dielectric layer 112*d*. To this end, a resistive material 114*d* and 116*d* is formed on the surfaces of the dielectric layer 112*d* within the area defined by the signal absorption ring 115*d*.

These are just a few of the many combinations that may be implemented. Any of the implementations shown in FIGS. 9A through 9I may be used to implement a signal absorption ring in or on any of the layers/surfaces of the layers. It is generally true that if the signal absorption ring is implemented on more than one layer or on more than one surface of the collective layers, the signal dampening will be more efficient and effective.

As described previously, signal dampening can be achieved by implementing a single signal absorption ring on any one of the layers of the CSB (which include at least two conductive layers and an intervening dielectric layer). However, faster and more effective dampening will be achieved through implementation of additional signal absorption rings that co-align through the z-axis (orthogonal to the x-y plane of the layers) of the CSB.

It is preferable to minimize the area of the signal absorption ring(s) used for dampening in order to maximize the area left for component connection to the power/ground planes. The implementation of a signal absorption ring on a particular CSB layer, however, does not preclude use of the area above the perimeter absorption ring for component attach as long as connection to the layer implementing the signal absorption ring (e.g., connection to a power plane implementing the signal absorption ring or ground plane implementing the signal absorption ring) is not required in that area.

The CSB is effectively a large plate capacitor that is formed with at least one signal absorption ring that dampens lateral flowing waves created by charge movement to and from sources and loads coupled to the large integral storage layer, thereby eliminating or at least substantially mitigating the resonance limitations of the capacitor. The reflective edge is effectively erased, yet the bypassing and isolating ability of the capacitor is not adversely affected.

Figure 11A:
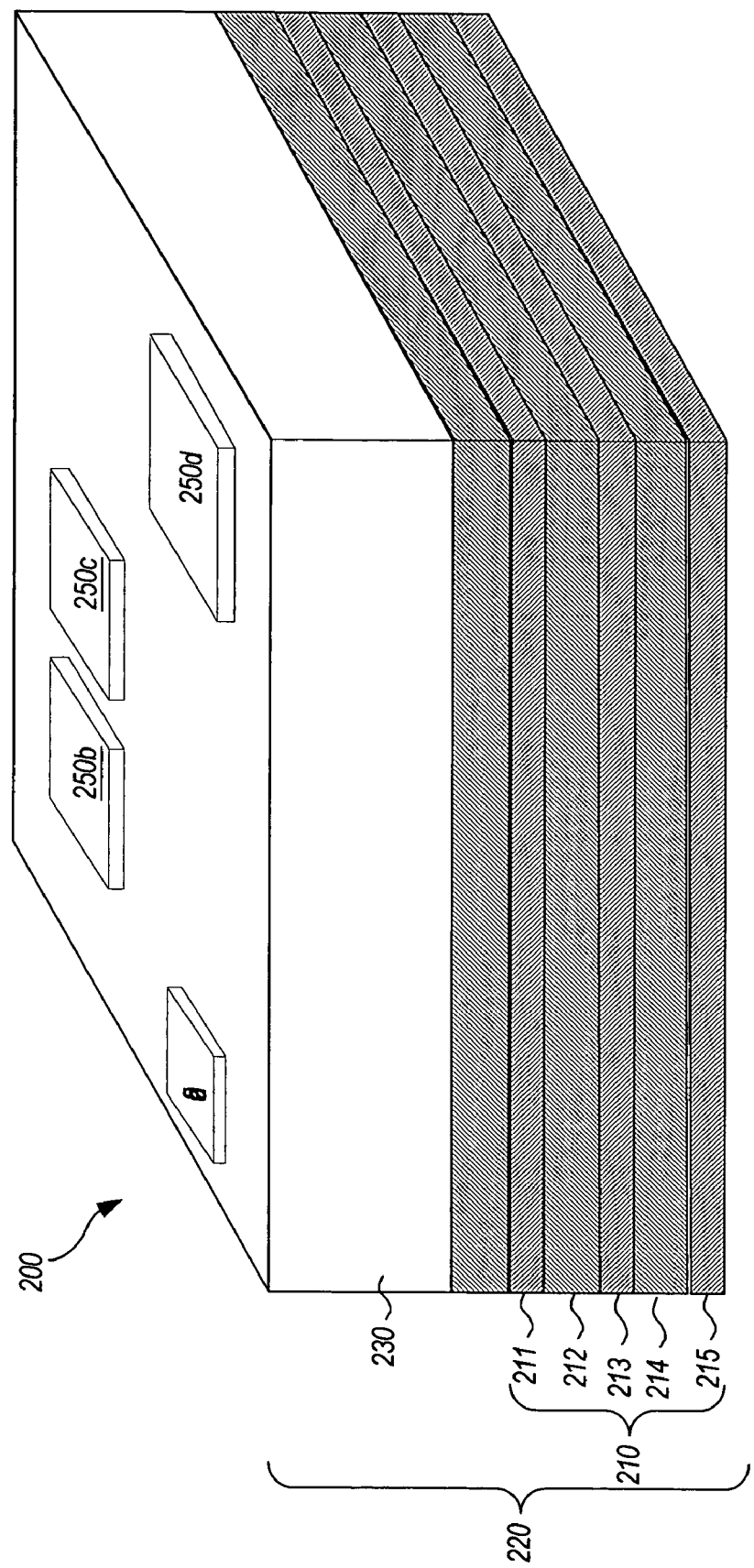
FIG. 11A is a perspective view of an integrated circuit device implementing a CSB in accordance with the invention.
Figure 11B:
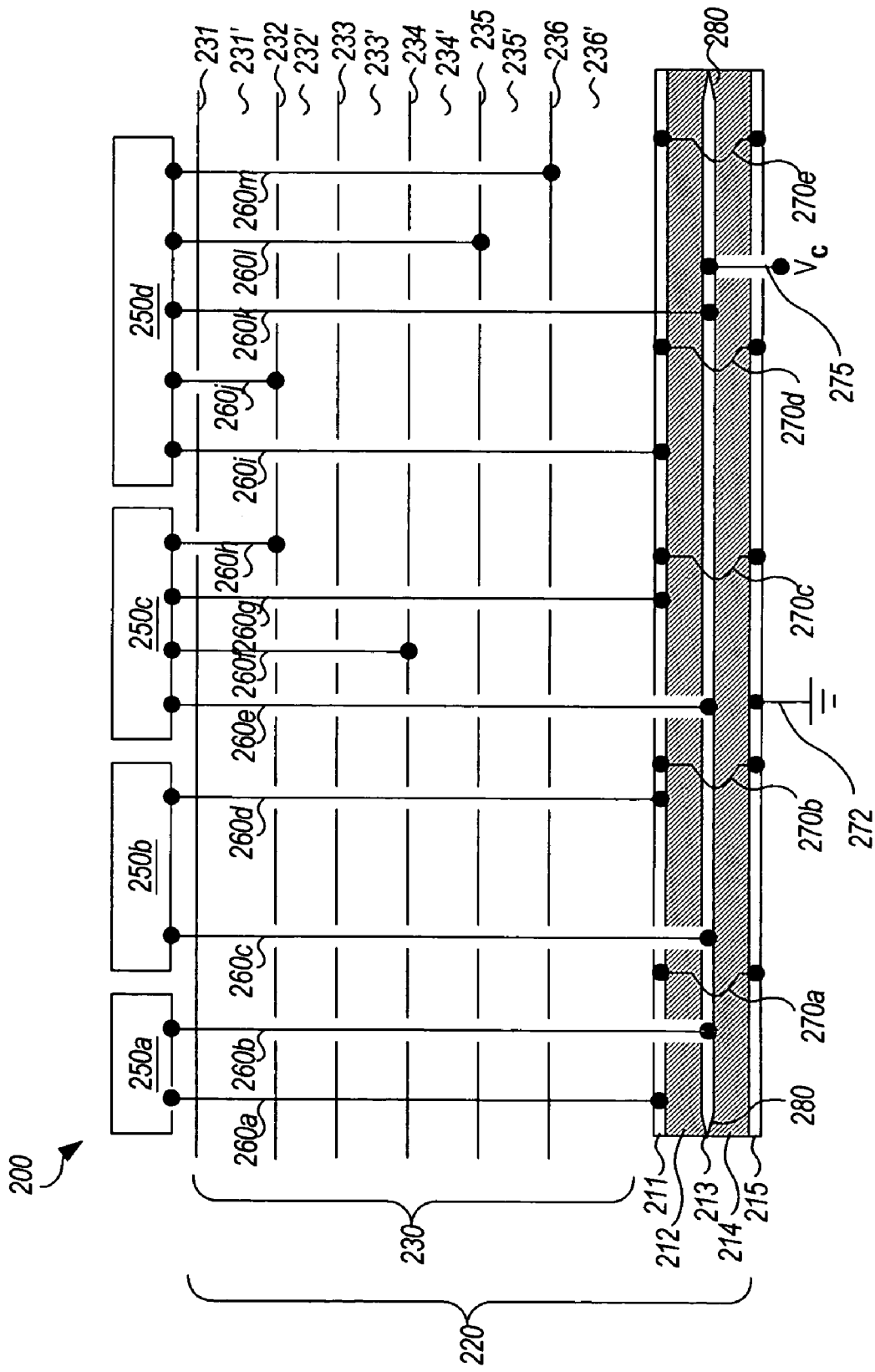
FIG. 11B is a side cross-sectional view of the integrated circuit device of FIG. 11B.

Turning now to preferred applications of the invention, FIG. 11A is a perspective view, and FIG. 11B is a cross-sectional side view an integrated circuit device 200 implementing a CSB 210 of the invention. The integrated circuit device 200 includes a substrate 220. The substrate 220 comprises a set of signal layers 230 and a charge storage basement (CSB) 210.

The CSB 210 comprises a plurality of conductive material layers 211, 213, 215 interleaved with layers of dielectric material 212, 214. More particularly, the CSB 210 includes a top conductive layer 211, a top high-dielectric layer 212, a center conductive layer 213, a bottom high-dielectric layer 214, and a bottom conductive layer 215. The center conductive layer 213 is connected to a power source $V_{CC}$ 275 and operates as a power plane. The bottom conductive layer 215 is connected to a device ground 272 and operates as a ground plane. The top and bottom conductive layers 211 and 215 are electrically connected by an array of vias 270a, 270b, 270c, 270d, 270e. The array of vias 270a, 270b, 270c, 270d, 270e provides intimate ground connections between the top and bottom conductive layers 211 and 215 so that the two conductive layers 211 and 215 together act as if they are one continuous ground plane, thereby increasing the length L of the plate capacitor.

The CSB 210 provides a near-instantaneous charge supply to electronic components 250a, 250b, 250c, 250d that may be attached to the substrate 220 and that connect to the power plane 213 of the CSB 210 through the signal layers 230 by way of one or more conductive paths 260 (implemented, for example, with vias and/or traces, preferably using the shortest path possible). Connections between the electronic components 250a, 250b, 250c, 250d and the ground plane (through connection to one of the top or bottom conductive layers 211 or 215) provides good wide-band RF ground returns.

More particularly, as illustrated in FIG. 11B, electronic components 250a, 250b, 250c, 250d attached to the substrate 220 may utilize one or more of the signal layers 231, 232, 233, 234, 235, 236 for routing signals between electronic components in a conventional manner that is well-known in the art. As also illustrated, the electronic components 250a, 250b, 250c, 250d utilizing the CSB 210 as a source of near-instantaneous charge each contact the power plane 213 of the CSB 210, preferably by way of one or more vias (through the signal layers 230 and CSB layers 210) that are, if possible, co-located at the location that the charge is needed in the electronic component 250a, 250b, 250c, 250d. In the particular example illustration, electronic component 250a is connected to the CSB power plane 213 by way of via 260b; electronic component 250b is connected to the CSB power plane 213 by way of via 260c; electronic component 250c is connected to the CSB power plane 213 by way of via 60e; electronic component 250d is connected to the CSB power plane 213 by way of via 260k. Electronic components 250a, 250b, 250c, and 250d are also connected to CSB ground plane 211 to provide a good RF ground return. In particular, electronic component 250a is connected to the CSB ground plane 211 by way of via 260a; electronic component 250b is connected to the CSB ground plane 211 by way of via 260d; electronic component 250c is connected to the CSB ground plane 211 by way of via 260g; electronic component 250d is connected to the CSB ground plane 211 by way of via 260i.

Each of the conductive planar layers 211, 213, and 215 includes a non-absorptive area of respective substantially constant resistance. In the illustrative example, the power plane 213 is formed with a signal absorption ring 280 that bounds a non-absorptive area 281. In the illustrative embodiment, only the power plane 213 includes the signal absorption ring 280, illustrated using tapered edges in FIG. 11B. The purpose of the signal absorption ring 280 is to dampen signal waves generated within the non-absorptive area 281 of the conductive plane 213 to eliminate or at least significantly reduce reflections. In this manner, the $N\lambda/2$ resonances that would otherwise arise at particular resonant frequencies are avoided, allowing a wide-band RF ground return. In the embodiment of FIGS. 9A and 9B, the CSB 210 provides excellent isolation between electronic components 250a, 250b, 250c, 250d that are attached to it due to the good, low-impedance ground return that the CSB 210 maintains over a wide band of frequencies. In this embodiment, the impedance between the ground planes 211 and 215 is low due to the array of connecting jumpers 270a-270e. The actual value of the impedance between the ground planes 211 and 215 can be adjusted by adjusting the number of connections between the planes and/or the material used to connect the ground planes.

Figure 12:
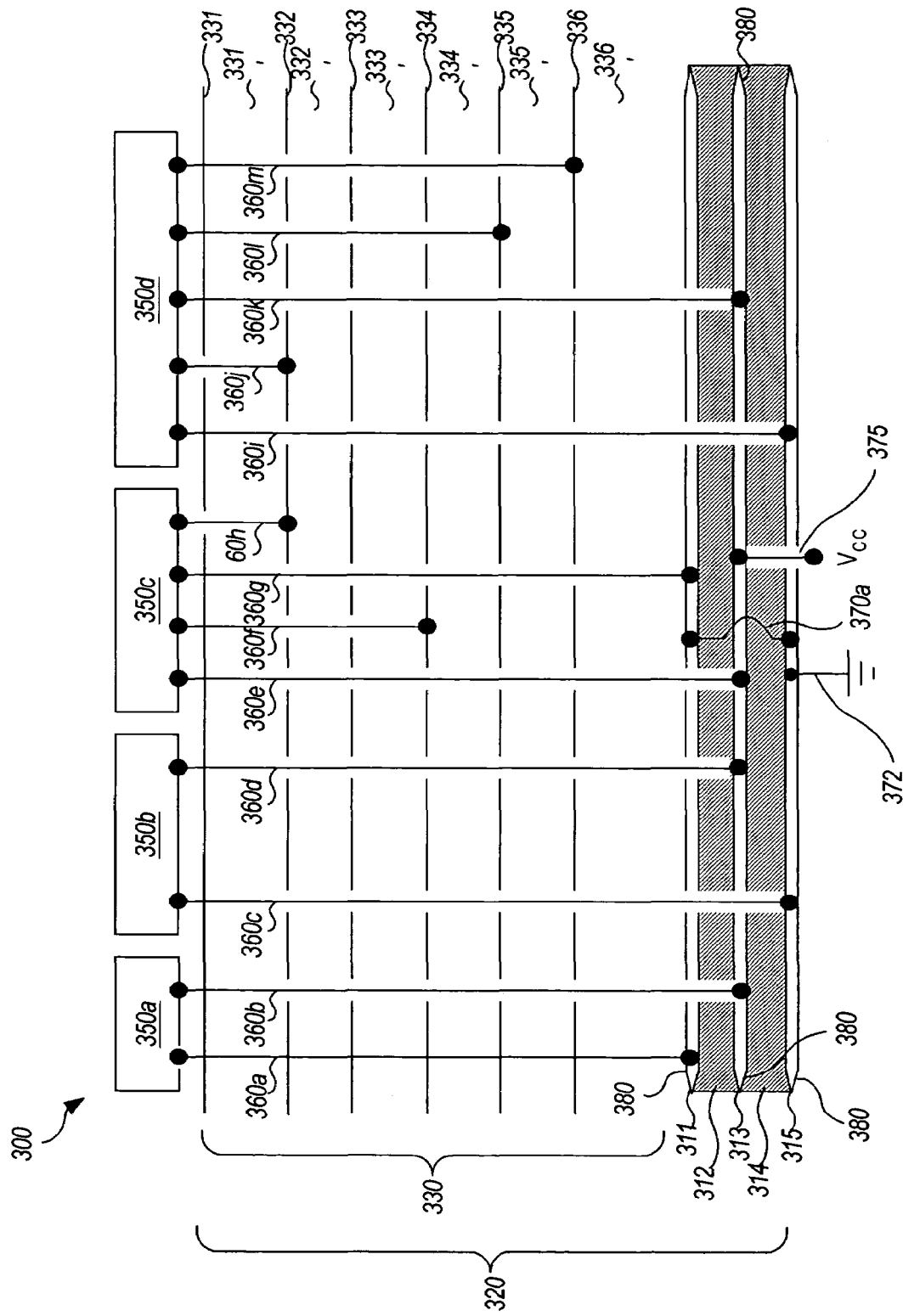
FIG. 12 is a side cross-sectional view of an integrated circuit device implementing a CSB in accordance with the invention and which allows circuit isolation.

When additional isolation is required between circuits the CSB can be implemented as illustrated in FIG. 12. As shown, this embodiment involves increasing the impedance between the ground planes 311 and 315 by reducing the number of jumpers between them to a single jumper 370a (illustrated, or a small few such jumpers to achieve the desired impedance) near the voltage source 375. Then, attaching electronic components to different ground planes 311 or 315 provides additional isolation between the electronic components due to the impedance that arises from the path from electronic component to electronic component and the impedance that arises on the single jumper 370a (or small few such jumpers) between the two ground planes 311 and 315. In the arrangement shown in FIG. 12, electronic component 350a is connected to the first plane 311 by way of via 360a; electronic component 350b is connected to the second ground plane 45 by way of via 360c; electronic component 350c is connected to the first ground plane 311 by way of via 360g; electronic component 350d is connected to the second ground plane 315 by way of via 360i. Electronic components 350a and 350c are therefore additionally isolated from electronic components 350b and 350d.

In the arrangement shown in FIG. 12, the CSB 310 services a single-sided printed circuit board with all components 350a, 350b, 350c, and 350d mounted to the same side of the substrate. Alternatively, the CSB may be implemented to service a double-sided PCB. For example, the CSB 310 could be fabricated in the center of the substrate 320, utilizing one set of CSB layers to service components mounted on one side of the PCB and another set of CSB layers to service components mounted on the other side of the PCB. If no isolation is required between the components on either side of the PCB, then the components on both sides of the board could tap into any of the layers of the CSB.

Increased isolation between electronic components may also be achieved by using separate power sources feeding the power planes of the CSB. For example, in the integrated circuit device 400 illustrated in FIG. 13A, the CSB 410 includes at least three conductive planes 411, 413, and 415, interleaved by dielectrics 412 and 414 as shown. This embodiment 400 achieves greater isolation by creating two separate circuits with the conductive planes 411, 413, and 415. In this embodiment, a separate voltage source 475a and 475b is coupled to each power plane 411 and 415, and a ground is coupled to plane 413. In the illustrative embodiment, electronic components 450a and 450c are connected to the power plane 411 by way of vias 460a and 460e respectively, and return ground paths are provided by way of via connections 460b and 460f respectively to ground plane 413. Electronic components 450b and 450d are connected to the power plane 415 by way of vias 460c and 460g respectively, and return ground paths are provided by way of via connections 460d and 460h respectively to ground plane 413. There is no jumper connecting power planes 411 and 415. Additional isolation may be achieved by increasing the number of power conductive layers and respective power source connections (interleaved by dielectric layers) in the stack. Additional ground conductive layers (coupled to the first ground layer 413 and interleaved by dielectric layers) may also be included in the stack to achieve additional capacitance.

Figure 13B:
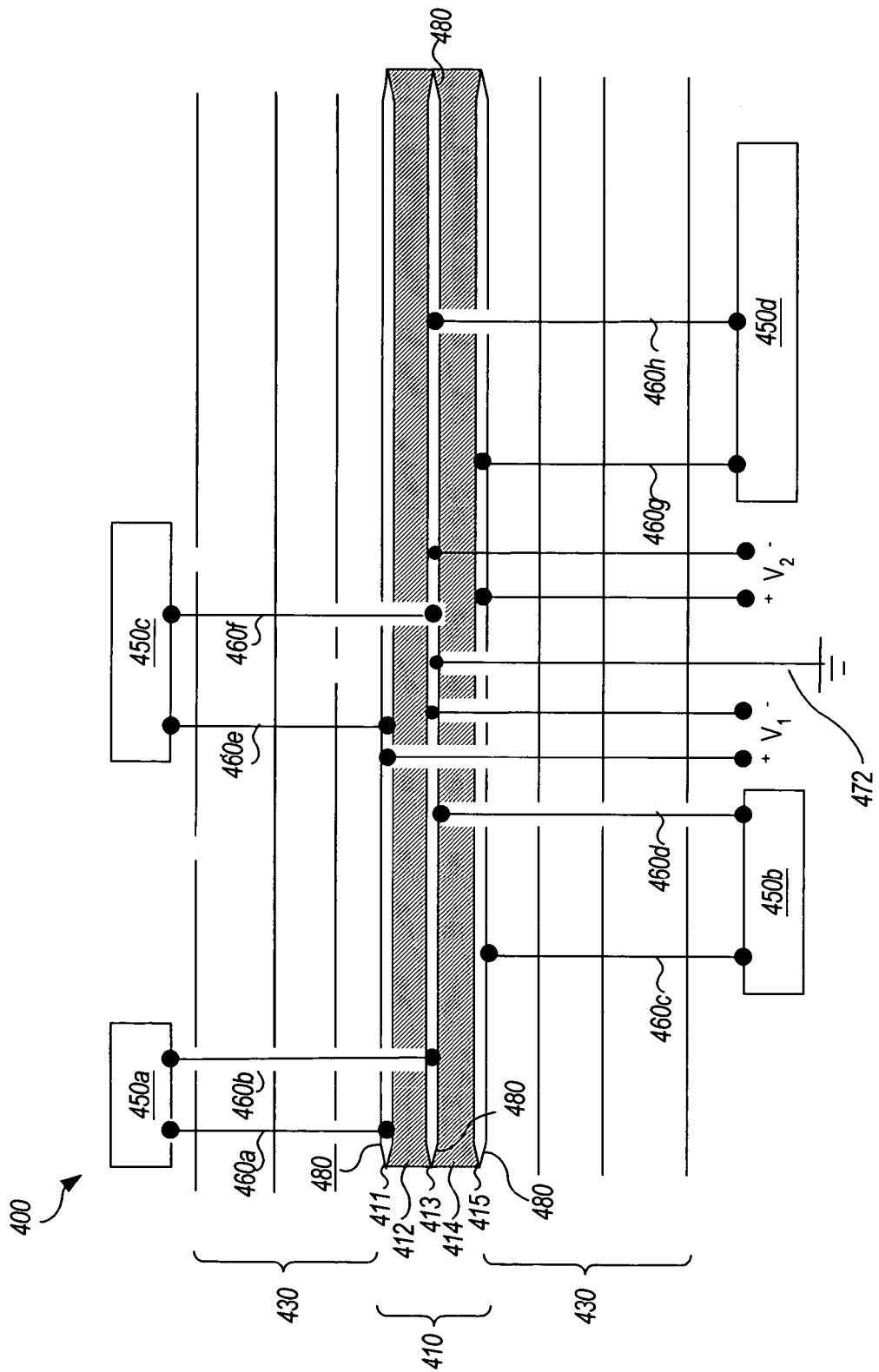
FIG. 13B is a side cross-sectional view of a double-sided integrated circuit device implementing a CSB in accordance with the invention and which allows circuit isolation using different power sources.

The CSB 410 of FIG. 13B may be implemented to service a double-sided PCB. For example, as shown in FIG. 14B, the CSB 410 could be fabricated in the center of the substrate 420, utilizing one set of CSB layers 411, 412, 413, powered by one power source $V_1$, to service components 450a, 450c mounted on one side of the PCB, and another set of CSB layers 413, 414, 415, powered by one power source $V_2$, to service components 450b, 450d mounted on the other side of the PCB.

Of course, it will be appreciated that the various embodiments shown may be combined to produce variations. The appropriate embodiment for a particular application will depend on whether it is more important to have the greater capacitance from creating parallel capacitors as in the preferred embodiment or the greater isolation from completely separate circuits, and of course, both may be achieved through the addition of one or more conductive layers interleaved by dielectric layers.

Figure 14:
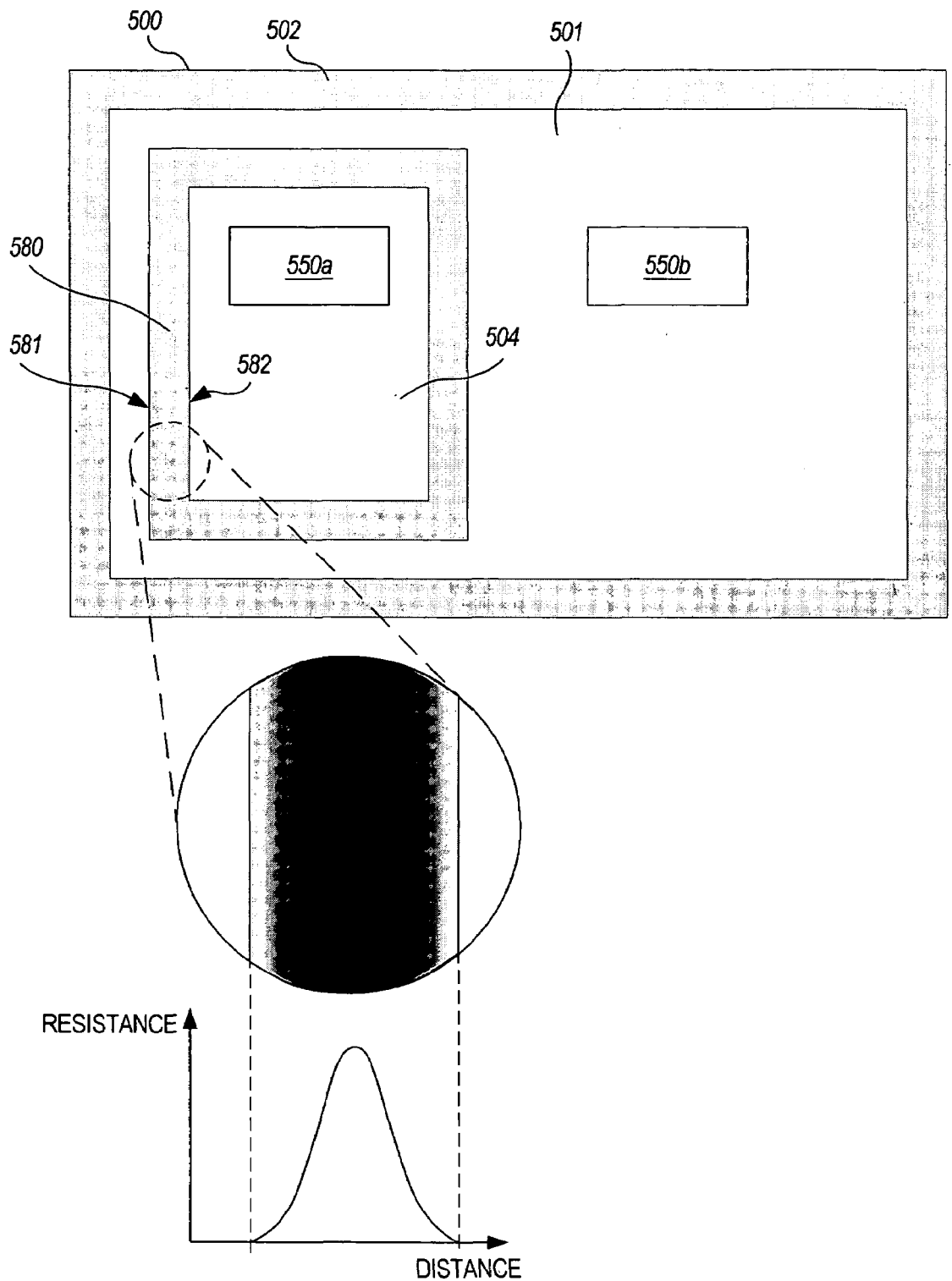
FIG. 14 is a plan view of a CSB layer implemented according to the invention to allow both signal isolation and signal protection with an exploded view of a section of a signal absorption ring.

Additional signal absorption rings may be used for increasing isolation between electronic components: For example, FIG. 14 shows a top plan view of a conductive planar layer 500 for implementing at least one of the conductive layers in a CSB. As shown, an electronic component 550a may be further isolated from surrounding circuitry (e.g., electronic component 550b) by implementing a second signal absorption ring 580 around a non-absorptive zone 504 and connecting electronic component 550a to the CSB within the area defined by the non-absorptive zone 504. In this case, the signal absorption ring 580 preferably is preferably implemented with a graded resistive profile that maximizes at the center (or somewhere between the inner and outer perimeters 581 and 585 of the signal absorption ring 580, and which gradually increases in a preferably linear or exponential manner from the perimeters 581 and 582 to the center or other chosen interior line of the signal absorption ring 580. This provides maximum isolation between electronic components 550a and 550b connected to the conductive layer 500, while also allowing signal dampening in both areas.

Figure 15A:
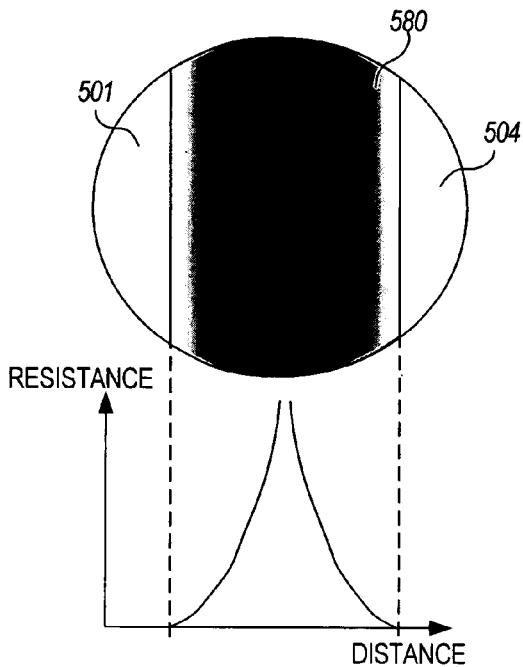
FIGS. 15A-15D are exploded plan views of sections of various signal absorption rings illustrating various embodiments for achieving both isolation and protection of components connected inside and outside the signal absorption rings.
Figure 15B:
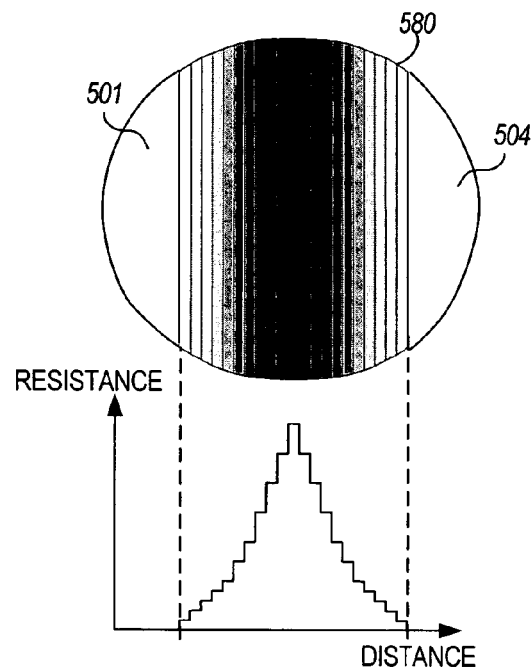
Figure 15C:
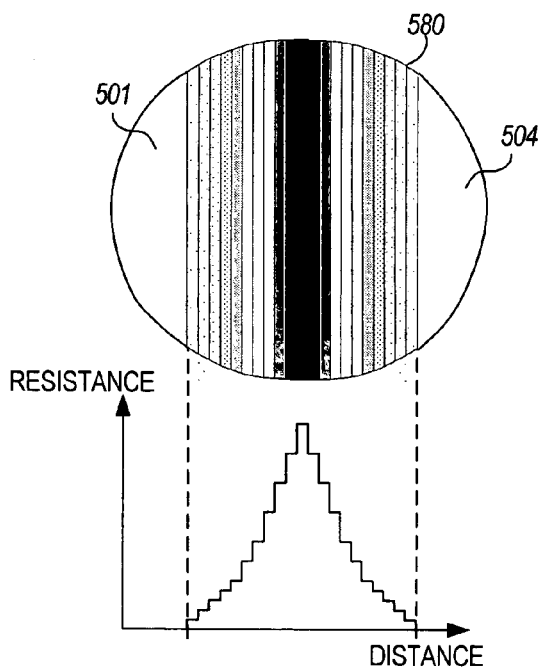
Figure 15D:
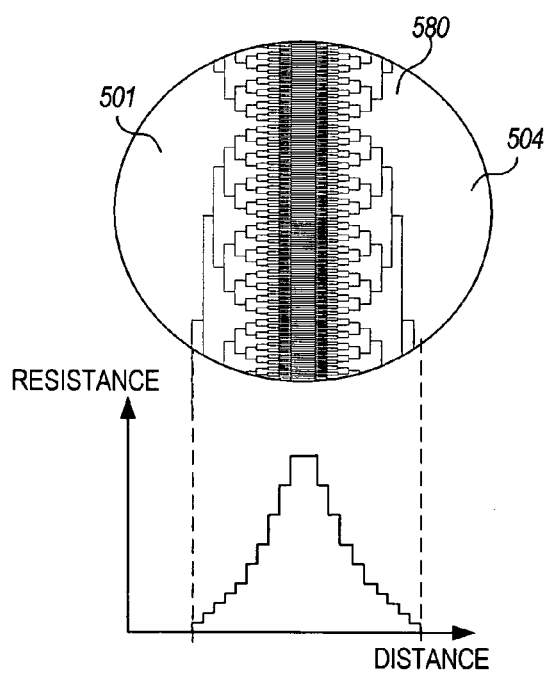

For maximum isolation and protection against reflection, the resistive profile of the signal absorption ring 580 should go from low impedance at the outer perimeter 581 to high impedance somewhere between the outer perimeter 582 and inner perimeter 582, and then back to low impedance at the inner perimeter 582. Various embodiments from achieving both isolation and protection are illustrated in FIGS. 15A-15D. FIG. 15A shows continuous resistive grading which begins with low resistivity at each of the perimeters 581 and 582 of the signal absorption ring 580 and increases, preferably in a substantially linear or exponential manner, as the center of the signal absorption ring 580 is approached. FIGS. 15B, 15C, and 15D illustrate techniques for achieving stepwise resistive grading using, respectively, smooth step grading, hole step grading, and fractal step grading. The embodiments of FIGS. 15B, 15C, and 15D also begin with low resistivity at the perimeters 581 and 582 and increase, preferably in a step-wise linear or exponential manner, as the center of the signal absorption ring 580 is approached.

Alternatively, if the signal absorption ring 580 is implemented with resistive grading according to one of the embodiments shown in FIGS. 9A-9I, the signal absorption ring 580 adds isolation to protect the sensitive circuits 550a connected within the sub-area 504 from circuitry 550b connected to the conductive layer in the first area 501 outside the signal absorption ring 580. In this regard, the graded resistive profile of the signal absorption ring 580 goes from low impedance at the outer perimeter 581 of the signal absorption ring 580 to high impedance at the inner perimeter 582 of the signal absorption ring 580. The isolation arises from the RF absorption that occurs as small signals from area 501 travel through the signal absorption ring 580 towards the isolated area 504. In this way, noise created by electronic components connected to the area 501 outside the signal absorption ring 580 do not contaminate the sensitive circuitry connected to the area 504 bounded by the signal absorption ring 580.

The signal absorption ring 580 may be alternatively implemented to isolate electronic components 550b connected to the area 501 of the conductive layer 500 outside the signal absorption ring 580 from signals traveling from electronic components 550a connected to the conductive layer 500 within the area 504 bounded by the signal absorption ring 580. In this regard, the graded resistive profile of the signal absorption ring 580 goes from low impedance at the inner perimeter 582 of the signal absorption ring 580 to high impedance at the outer perimeter 581 of the signal absorption ring 580.

Of course, additional absorptive boundaries may be implemented anywhere on the conductive plane as needed to create isolated areas of integral charge storage for use in isolating the electronic components of the integrated circuit from one another where desired. Absorptive boundaries may also be implemented within sub-areas, sub-sub-areas, and so on, for the same reasons.

In theory, resistive grading need not be implemented at the physical edges of the conductive planes of the CSB if signal absorption rings with resistive grading are formed around charge storage areas on the substrate to minimize reflections of signals enclosed in the charge storage areas. However, in many applications, one should also implement resistive grading at one or more of the physical edges of the conductive planes of the CSB for power reasons. More specifically, if the integrated circuit power source is connected in the center of the chip, as it often is, for example in the non-absorptive area 501 of a conductive plane implemented according to the CSB layer illustrated in FIG. 14, but not in non-absorptive area 504, all the power loads are located in area 501. Accordingly, there is no DC resistance between the power source and the power loads. However, all the noise that is generated in area 501 is propagated and gets reflected by the physical edges of the conductive planes. Thus, because there is no resistive grading at the physical edges of the conductive planes of the CSB 540, there are no $I^2R$ losses. However, to get power to electronic components connected to the area 504 within the signal absorption ring 580, the power signals must pass through the signal absorption ring 580. Thus, these power signals are subject to $I^2R$ losses. Accordingly, the designer must balance the power requirements of the electronic components within the signal absorption ring 580 with the amount of isolation desired. It is contemplated by the inventor that typical applications will utilize the boundary 580 mainly for isolation purposes and less for pure reflection absorption due to these considerations. Accordingly, a typical application will keep the area 504 within the signal absorption ring 580 physically small and allow a few reflections.

FIG. 16 illustrates a charge storage basement 610 implemented integral to a circuit package 620 rather than as part of the integrated circuit die 600 itself. In this embodiment, an integrated circuit package 620 includes a number of interconnect layers 630 and a charge storage basement 610. The package 620 includes a circuit bed 640 for seating an integrated circuit die 600. The integrated circuit die 600 is provided with input/output (I/O) pads or leads. In the preferred embodiment, the integrated circuit die utilizes ball grid array (BGA) or flip-chip technology for attachment of the integrated circuit die to the package. This allows a direct path from the power and ground (I/O) pads or leads to the power and ground planes of the CSB 610, namely comprising the number of vias required to pass through the interconnect layers and interleaving dielectric layers to reach the appropriate CSB layer.

The CSB 610 is implemented in the same manner as described above with respect to the CSB 610 for the circuit die 600. Thus the concepts are identical and the CSB 610 may be implemented in accordance with any of the example embodiments discussed herein. The only real difference is that the CSB 610 is implemented in the circuit packaging and thus has a longer path and potentially more resonance limitations then when implemented integral to the integrated circuit die itself.

In the preferred embodiment, the CSB is integrated into the integrated circuit die itself, providing extremely fast charge delivery and good wide-band RF return paths to the components of the IC.

Figure 17:
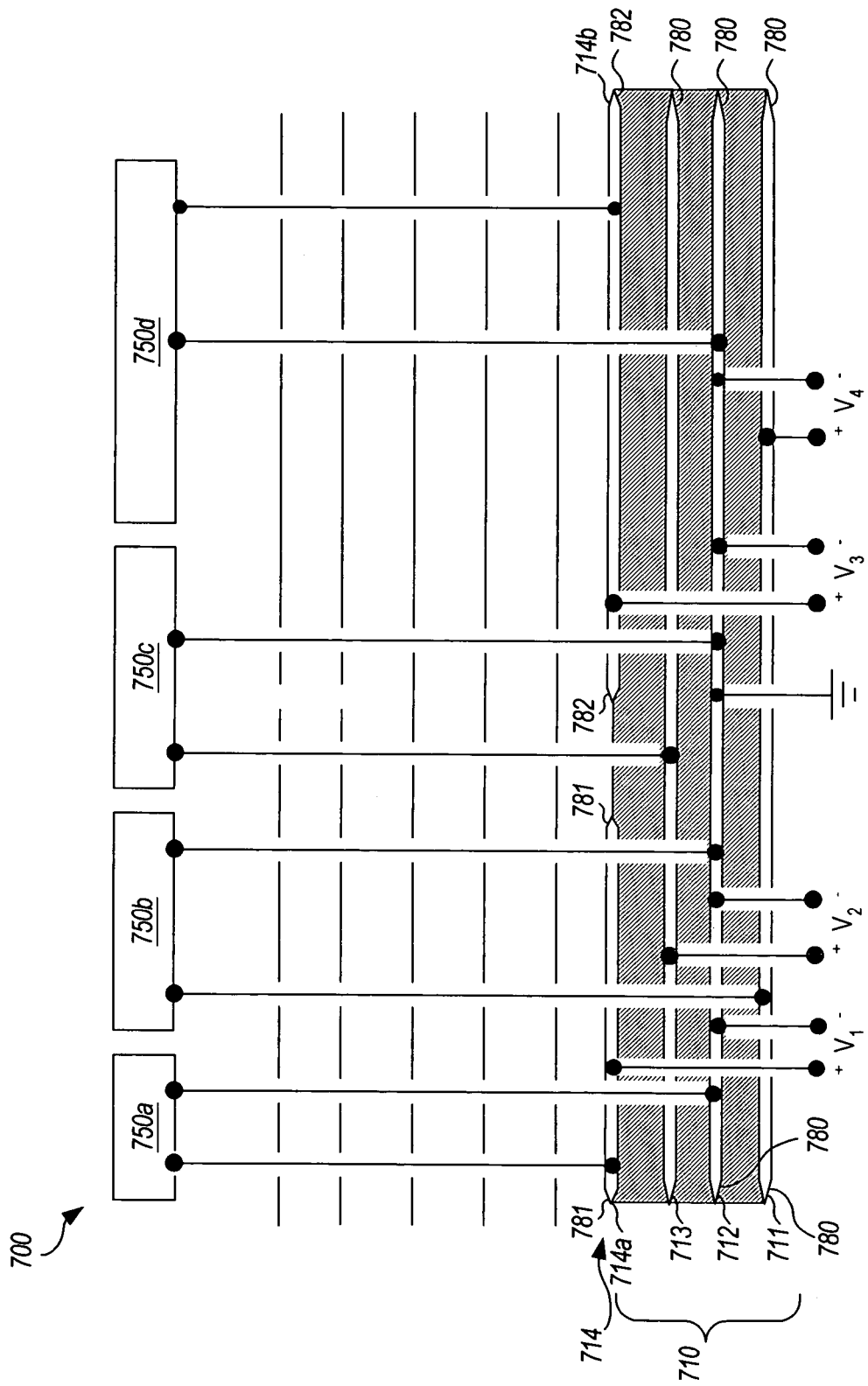
FIG. 17 is a side cross-sectional view of an integrated circuit illustrating an alternative variation of the CSB technique for achieving isolation of circuits.
Figure 18:
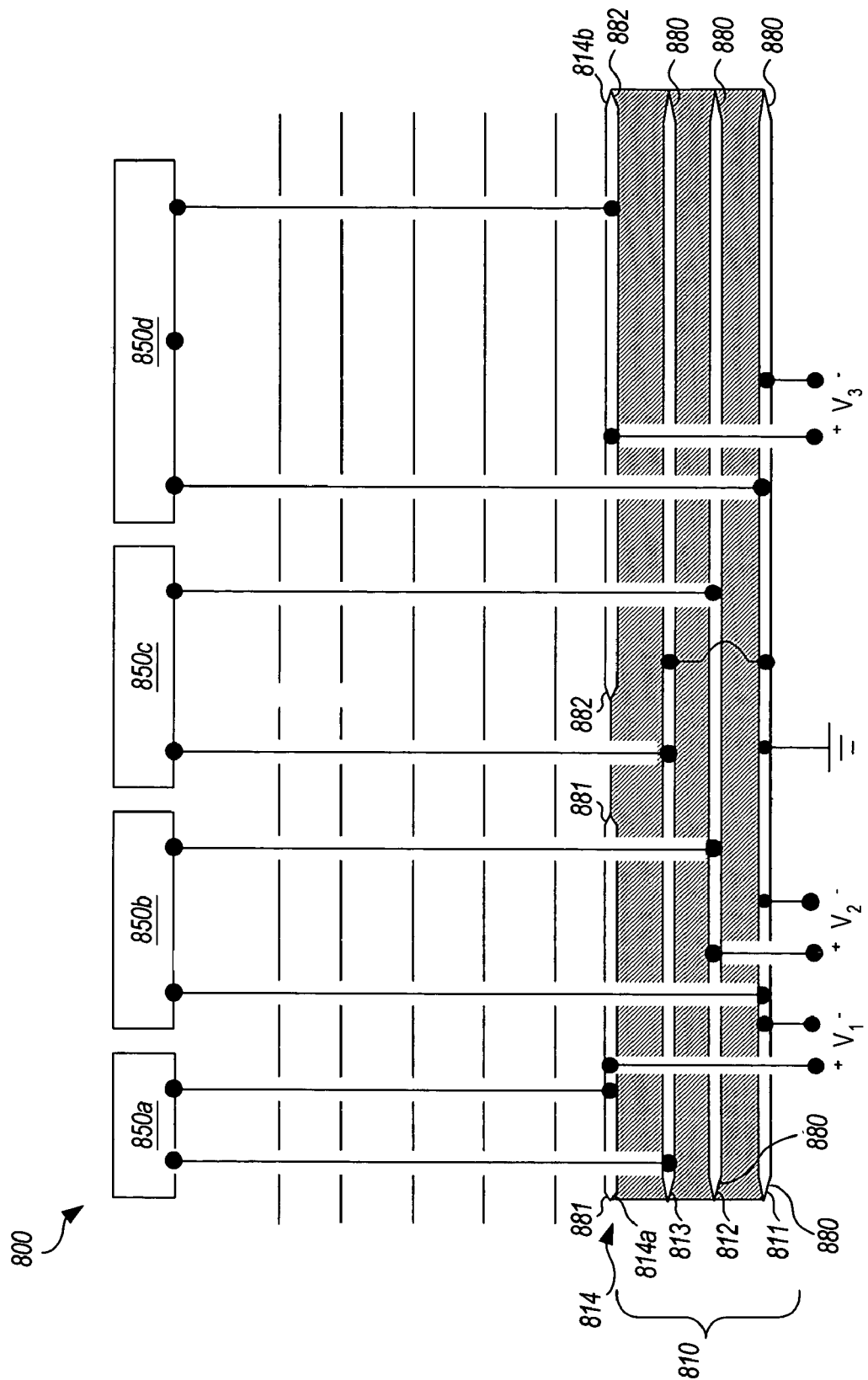
FIG. 18 is a side cross-sectional view of an integrated circuit illustrating another variation of the CSB technique for achieving isolation of circuits.
Figure 19:
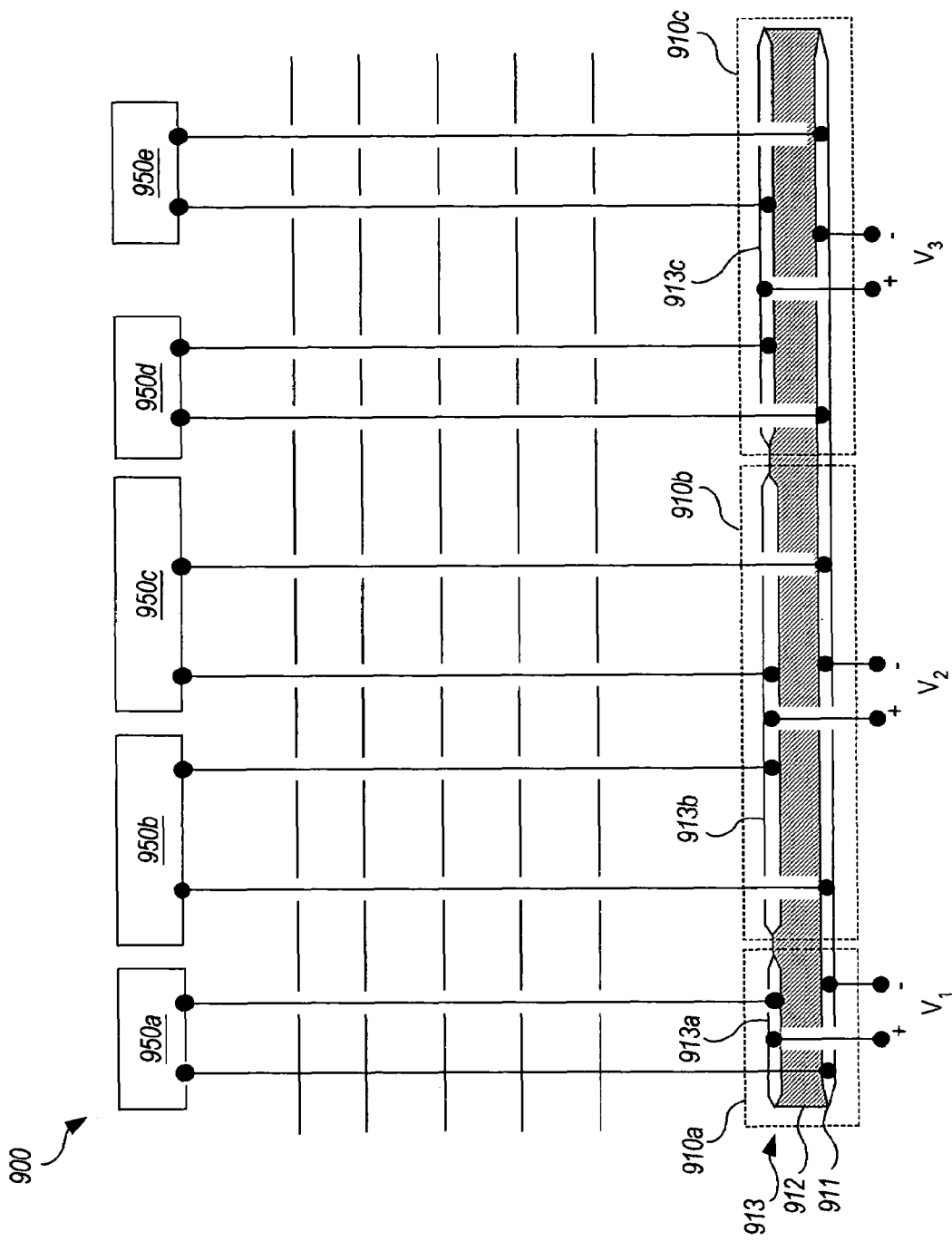
FIG. 19 is a side cross-sectional view of an integrated circuit package implemented according to the invention.

In FIGS. 17, 18, and 19, various partial implementations of CSBs of the invention are illustrated. These partial implementations allow for the power distribution of multiple power supplies $V_1, V_2, V_3, V_4$ to the same or different sections of any given substrate in which the CSB power distribution circuits are implemented. Here, not only can multiple power supplies be implemented as was the case XXX where two whole board ½ CSB's were implemented to obtain increased isolation, but increased isolation can be had here in a generalized way for any number of power supplies in any combination of layers, areas of the layers, and power supplies connected to the layers.

For example, FIG. 17 illustrates an integrated circuit device 700 with a CSB 710 comprising four conductive layers 711, 712, 713, and 714. Conductive layer 714 comprises two mutually exclusive areas 714a, 714b of conductive material. Each conductive layer 711, 712, 713, 714 (and sub-area 714a, 714b of the layer 714) implements a signal absorption ring 780, 781, 782. Layer 712 operates as the ground layer, which is connected to a circuit ground. Component 750a connects to conductive layer 714a, which is connected to a power source $V_1$. Component 750b connects to conductive layer 711, which is connected to a power source $V_2$. Component 750c connects to conductive layer 713, which is connected to a power source $V_3$. Component 750d connects to conductive layer 714b, which is connected to a power source $V_4$. Each of components 750a, 750b, 750c, 750d are electrically isolated from one another between they are connected to different power planes sourced by different power supplies. $V_1, V_2, V_3,$ and $V_4$.

FIG. 18 illustrates another example of an integrated circuit device 800 with a CSB 810 comprising four conductive layers 811, 812, 813, and 814. Again, conductive layer 814 comprises two mutually exclusive areas 814a, 814b of conductive material. Each conductive layer 811, 812, 813, 814 (and sub-area 814a, 814b of the layer 814) implements a signal absorption ring 880, 881, 882. Layers 811 and 813 are electrically connected to one another, and together operate as the ground layer, which is connected to a circuit ground. Component 850a connects to conductive layer 814a, which is connected to a power source $V_1$. Components 850b and 850c connect to conductive layer 812, which is connected to a power source $V_2$. Component 850d connects to conductive layer 814b, which is connected to a power source $V_3$. Component 850a is electrically isolated from components 850b, 850c, and 850d. Components 850b and 850c are electrically isolated from components 850a and 850d. Component 850d is electrically isolated from components 850a, 850b, and 850c.

FIG. 19 illustrates another example of an integrated circuit device 900 having three separate integral CSBs 910a, 910b, 910c, implemented using only two conductive layers 911, 913 and an intervening dielectric layer 912. Conductive layer 913 comprises three mutually exclusive areas 913a, 913b, 913c of conductive material, each connected to a different power source $V_1, V_2, V_3$. Each conductive layer 911, 913 (and sub-areas 913a, 913b of the layer 913) implements a signal absorption ring 980. Component 950a connects to conductive layer 913a, which is connected to a power source $V_1$. Components 950b and 950c connect to conductive layer 913b, which is connected to a power source $V_2$. Components 950d and 950e connect to conductive layer 913c, which is connected to a power source $V_3$. Component 950a is electrically isolated from components 950b, 950c, 950d, and 950e. Components 950b and 950c are electrically isolated from components 950a, 950d, and 950e. Components 950d and 950e are electrically isolated from components 950a, 950b, and 950c.

FIGS. 17, 18, and 19 illustrating separate yet integral CSBs used to implement a particularly complex and diverse power distribution set of networks. Here are illustrated a specific example of multi-power supplies being distributed to various sections of the board. Some supplies are attached to a single CSB while others are attached to more than one CSB. In fact for many single or dual power supply applications a single or dual CSB may be used. However the use of a generalized set of CSBs both integral and discrete to solve any particular single or multi-power-supply power distribution network is covered by the present invention.

Figure 20:
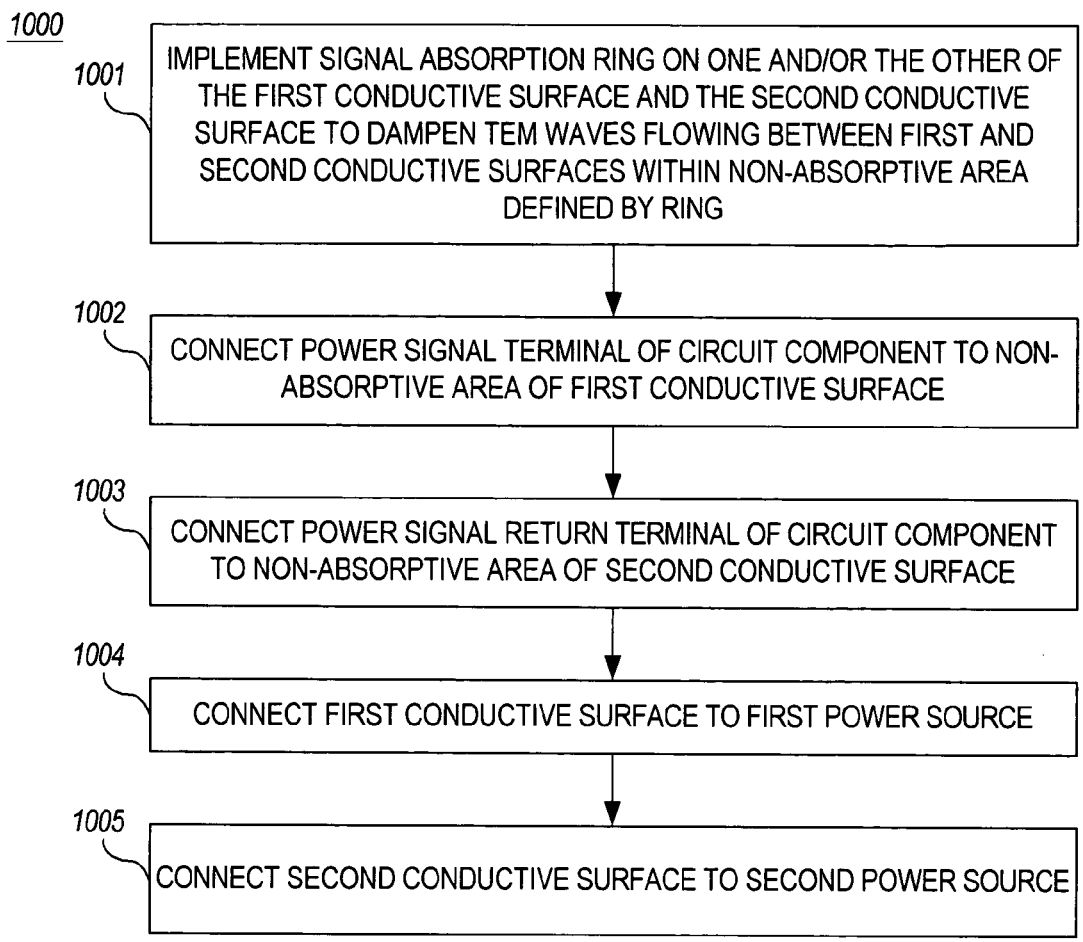
FIG. 20 is an operational flowchart illustrating an exemplary method for providing charge to an electronic component.

FIG. 20 illustrates a flowchart of an exemplary method 1000 for providing charge to a circuit component. As illustrated, this method comprises the steps of: implementing one or more signal absorption rings that respectively bounds a respective non-absorptive area of at least one of a respective first conductive surface and/or a respective second conductive surface, the signal absorption ring operating to dampen laterally flowing Transverse Electric Magnetic (TEM) waves between the respective non-absorptive area of the first conductive surface and the respective non-absorptive area of the second conductive surface (step 1001); connecting a power signal terminal of the circuit component to the respective non-absorptive area of the first conductive surface (step 1002); connecting a power signal return terminal of the circuit component to the respective non-absorptive area of the second conductive surface (step 1003); connecting the first conductive surface to a first power source (step 1004); and connecting the second conductive surface to a second power source, the second power source at a different potential than the first power source (step 1005). Each of the techniques described previously with respect to implementing the signal absorption rings can be applied to implement the one or more signal absorption rings.

Figure 21:
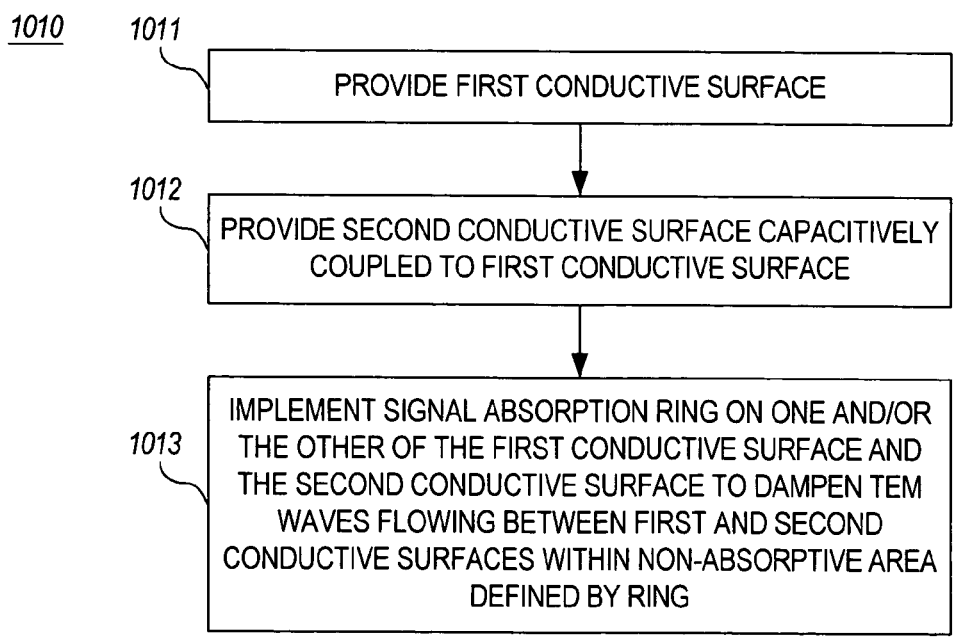
FIG. 21 is an operational flowchart illustrating a method for fabricating a CSB in accordance with the invention.

FIG. 21 illustrates a flowchart of an exemplary method 1010 for fabricating a capacitor in accordance with the invention. As illustrated, this method comprises the steps of: providing a first conductive surface (step 1011); providing a second conductive surface isolated from the first conductive surface but capacitively coupled to the first conductive surface (step 1012); and implementing a signal absorption mechanism that operates to dampen laterally flowing Transverse Electric Magnetic (TEM) waves between the first conductive surface and the second conductive surface (step 1013). Again, each of the techniques described previously with respect to implementing the signal absorption rings can be applied to implement the one or more signal absorption rings.

The present invention offers many advantages over the prior art. In this respect, the CSB provides near-instantaneous charge by reducing the distance between the circuit loads and the power source to the length of a single via (i.e., the length of a lead through layers in the substrate to the electronic components on top of it.) The CSB is a structure of layered conductive and dielectric materials integrated into the chip die or die packaging, creating charge storage available to the electronic components located-above or below it. Because the CSB provides a power source that is nearly co-located with the load, inductance over the power-delivery path is very low, making power-delivery extremely responsive, nearly instantaneous. Also, because the charge is stored everywhere in the IC or printed circuit board, designers are free to locate the electronic components anywhere on the substrate without having to develop power delivery circuitry.

Earlier attempts to integrate a wideband capacitive structure into chip packaging have been limited in their success because of standing wave resonances that form over the length of the conductive layers. In the CSB, this limitation is overcome, for example, by introducing a signal absorption ring of gradually increasing loss at the physical edges of one or more of the conductive layers and/or surrounding the perimeter of certain electronic components/circuits implemented on the integrated circuit. The signal absorption ring dampens the waves as they approach the physical edges, thereby eliminating standing wave resonances.

Another advantage of the present invention over the prior art is that the CSB eliminates the design complexities outlined in the background section by providing a good RF ground path over a wide range of frequencies. The mechanism by which it provides this ground path is by providing such a short path (i.e., as short as a via length) to available charge storage that it practically eliminates the parasitic inductance. Therefore, even if a large whole chip bypass capacitor is built into the integrated circuit, no parallel resonance results.

Yet another advantage of the present invention over the prior art is that the CSB replaces all the bypass capacitors, thereby reducing the number of circuit elements on the chip. In addition, by including the CSB on the chip, many of the bypass capacitors on the PCB can be eliminated.

Another advantage of the present invention over the prior art is the CSB's ability to isolate electronic components. The preferred embodiment of the CSB provides good isolation between electronic components and/or circuits on the integrated circuit by providing improved wideband ground returns. Where additional isolation is needed, circuits can be isolated from one another by implementing separate signal absorption rings around them.

What is claimed is:

1. A capacitor, comprising:
   a plurality of conductive layers;
   a set of dielectric layers interleaved between each of the plurality of conductive layers; and
   one or more signal absorption rings each of which respectively bounds a corresponding respective non-absorptive surface area of one or more of the plurality of conductive layers and/or one or more of the set of dielectric layers, the one or more signal absorption rings introducing one or more of resistive loss, dielectric loss, magnetic loss, and/or radiation loss.

2. The capacitor of claim 1, wherein at least one of the one or more signal absorption rings is implemented around the outer perimeter of the respective layer on which it is implemented.

3. The capacitor of claim 2, comprising one or more signal absorption rings implemented within the bounded surface area of another signal absorption ring that is implemented around the outer perimeter of the respective layer on which it is implemented.

4. The capacitor of claim 1, wherein one or more of the plurality of conductive layers and/or one or more of the set of dielectric layers comprise a plurality of signal absorption rings implemented on its respective layer.

5. The capacitor of claim 1, wherein the plurality of conductive layers comprises at least two ground conductive layers electrically connected to one another, wherein one of the at least two ground layers is connected to a ground and at least one of the plurality of conductive layers is connected to a power source.

6. The capacitor of claim 1, wherein the plurality of conductive layers comprises at least two ground conductive layers electrically connected to one another by a single connection, wherein one of the at least two ground layers is connected to a ground and at least one of the plurality of conductive layers is connected to a power source.

7. The capacitor of claim 1, wherein the plurality of conductive layers comprises at least one conductive layer connected to a first power source and at least one conductive layer connected to a second power source, the first power source at a different potential than the second power source.

8. The capacitor of claim 1, comprising a plurality of sets of conductive layers, each of the plurality of sets of conductive layers powered by independent power sources.

9. The capacitor of claim 8, wherein the independent power sources are at the same potential.

10. The capacitor of claim 8, wherein at least two of the independent power sources are at different potentials.

11. The capacitor of claim 1, wherein at least one of the conductive layers comprises a plurality of independent isolated conductive areas, a plurality of the independent isolated conductive areas of the layer having a signal absorption ring.

12. The capacitor of claim 11, wherein the plurality of independent isolated conductive areas of the layer are powered by independent power sources.

13. The capacitor of claim 12, wherein the independent power sources are at the same potential.

14. The capacitor of claim 12, wherein at least two of the independent power sources are at different potentials.

15. The capacitor of claim 11, wherein the signal absorption ring is implemented at the outer perimeter of its respective independent isolated conductive area.

16. The capacitor of claim 1, wherein at least one of the one or more signal absorption rings comprises lossy material added to its respective layer.

17. The capacitor of claim 16, wherein a loss density of the lossy material increases between an inner perimeter of the signal absorption ring surrounding the non-absorptive area and an outer perimeter of the signal absorption ring.

18. The capacitor of claim 16, wherein a thickness of the lossy material decreases between an inner perimeter of the signal absorption ring surrounding the non-absorptive area and an outer perimeter of the signal absorption ring.

19. The capacitor of claim 16, wherein the lossy material comprises areas of electrical discontinuity between an inner perimeter of the signal absorption ring to an outer perimeter of the signal absorption ring.

20. The capacitor of claim 1, wherein at least one of the one or more signal absorption rings comprises lossy material added to the material composition of its respective layer.

21. The capacitor of claim 20, wherein a loss density of the lossy material increases between an inner perimeter of the respective signal absorption ring surrounding its respective non-absorptive area and an outer perimeter of the respective signal absorption ring.

22. The capacitor of claim 1, wherein at least one of the one or more signal absorption rings comprises a decrease in thickness of the respective layer on which the respective signal absorption ring is implemented.

23. The capacitor of claim 1, wherein at least one of the one or more signal absorption rings comprises areas of discontinuity in the layer in which the signal absorption ring is implemented between an inner perimeter of the respective signal absorption ring to an outer perimeter of the signal absorption respective ring.

24. The capacitor of claim 1, wherein:
the plurality of conductive layers comprise a first set of one or more first conductive layers electrically connected together and a second set of one or more second conductive layers electrically connected together, the first set of one or more first conductive layers at a first potential and the second set of one or more second conductive layers at a second potential different than the first potential.

25. The capacitor of claim 24, wherein the first set of one or more first conductive layers are interleaved with the second set of one or more conductive layers, with a dielectric layer sandwiched between each of the plurality of conductive layers.

* * * * *